(12) United States Patent
Yamagata et al.

(10) Patent No.: US 7,423,293 B2
(45) Date of Patent: Sep. 9, 2008

(54) LIGHT EMITTING DEVICE

(75) Inventors: Hirokazu Yamagata, Adachi-ku (JP);
Shunpei Yamazaki, Setagaya-ku (JP);
Toru Takayama, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 10/810,675

(22) Filed: Mar. 29, 2004

(65) Prior Publication Data

US 2004/0178726 A1 Sep. 16, 2004

Related U.S. Application Data

(62) Division of application No. 10/073,285, filed on Feb. 13, 2002, now Pat. No. 6,720,198.

(30) Foreign Application Priority Data

Feb. 19, 2001 (JP) ............................. 2001-041201

(51) Int. Cl.
*H01L 29/04* (2006.01)
*H01L 31/036* (2006.01)
*H01L 31/20* (2006.01)

(52) U.S. Cl. .................... 257/72; 257/40; 257/59; 257/88

(58) Field of Classification Search ............... 257/40, 257/59, 66, 72, 79–103, E27.131
See application file for complete search history.

(56) References Cited

U.S. PATENT DOCUMENTS

| | | | |
|---|---|---|---|
| 4,891,334 A | 1/1990 | Satoh et al. | |
| 5,447,824 A | 9/1995 | Mutsaers et al. | |
| 5,550,066 A | 8/1996 | Tang et al. | |
| 5,669,979 A | 9/1997 | Elliott et al. | |
| 5,853,905 A | 12/1998 | So et al. | |
| 5,929,561 A | 7/1999 | Kawami et al. | |
| 6,115,090 A | 9/2000 | Yamazaki | |

(Continued)

FOREIGN PATENT DOCUMENTS

EP    0 962 984    12/1999

(Continued)

OTHER PUBLICATIONS

S. Miyashita et al., "Full Color Displays Fabricated by Ink-Jet Printing," Asia Display/IDW'01, pp. 1399-1402, 2001.

(Continued)

*Primary Examiner*—Shouxiang Hu
(74) *Attorney, Agent, or Firm*—Eric J. Robinson; Robinson Intellectual Property Law Office, P.C.

(57) ABSTRACT

A method of manufacturing a high quality light emitting device is provided, in which light emitting elements having long life are manufactured by using light emitting elements having a structure that deteriorates less easily than conventional structures. After forming a bank, an exposed anode surface is wiped using a PVA (polyvinyl alcohol)-based porous medium, performing leveling and removal of debris. An insulating film is formed covering the bank and the anode, unevenness on the anode surface is covered, and the balance between the amount of holes and electrons injected into an organic compound layer can be regulated.

40 Claims, 21 Drawing Sheets

U.S. PATENT DOCUMENTS

| | | |
|---|---|---|
| 6,120,584 A | 9/2000 | Sakata et al. |
| 6,150,668 A | 11/2000 | Bao et al. |
| 6,187,684 B1 | 2/2001 | Farber et al. |
| 6,194,837 B1 * | 2/2001 | Ozawa .................... 315/169.1 |
| 6,218,206 B1 | 4/2001 | Inoue et al. |
| 6,222,314 B1 | 4/2001 | Arai et al. |
| 6,246,179 B1 | 6/2001 | Yamada |
| 6,308,369 B1 | 10/2001 | Garcia et al. |
| 6,335,716 B1 | 1/2002 | Yamazaki et al. |
| 6,359,320 B1 | 3/2002 | Yamazaki et al. |
| 6,416,888 B1 | 7/2002 | Kawamura et al. |
| 6,492,778 B1 | 12/2002 | Segawa |
| 6,512,504 B1 | 1/2003 | Yamauchi et al. |
| 6,538,374 B2 * | 3/2003 | Hosokawa .................. 313/504 |
| 6,541,918 B1 | 4/2003 | Yudasaka |
| 6,569,544 B1 | 5/2003 | Alain et al. |
| 6,583,471 B1 | 6/2003 | Yamazaki et al. |
| 6,593,990 B1 | 7/2003 | Yamazaki |
| 6,614,174 B1 | 9/2003 | Urabe et al. |
| 6,633,121 B2 | 10/2003 | Eida et al. |
| 6,680,577 B1 | 1/2004 | Inukai et al. |
| 6,737,717 B2 | 5/2004 | Yamazaki et al. |
| 6,793,962 B2 | 9/2004 | Yano et al. |
| 6,879,309 B2 | 4/2005 | Yamauchi et al. |
| 6,909,114 B1 | 6/2005 | Yamazaki |
| 6,927,826 B2 | 8/2005 | Yamazaki |
| 7,098,088 B2 | 8/2006 | Yamazaki et al. |
| 7,172,928 B2 | 2/2007 | Yamazaki |
| 7,190,428 B2 | 3/2007 | Yamazaki |
| 7,274,349 B2 | 9/2007 | Yamauchi et al. |
| 2001/0041270 A1 | 11/2001 | Maruyama et al. |
| 2002/0018153 A1 | 2/2002 | Kitabayashi |
| 2002/0024493 A1 | 2/2002 | Ozawa et al. |
| 2002/0066902 A1 | 6/2002 | Takatoku |
| 2002/0071995 A1 | 6/2002 | Montgomery et al. |
| 2002/0079484 A1 | 6/2002 | Yamazaki et al. |
| 2002/0110940 A1 | 8/2002 | Yamagata et al. |
| 2002/0113248 A1 | 8/2002 | Yamagata et al. |
| 2002/0153831 A1 | 10/2002 | Sakakura et al. |
| 2005/0041122 A1 | 2/2005 | Yamazaki et al. |
| 2005/0104068 A1 | 5/2005 | Yamazaki |
| 2006/0051906 A1 | 3/2006 | Yamazaki |
| 2006/0263955 A1 | 11/2006 | Yamazaki et al. |
| 2007/0263133 A1 | 11/2007 | Yamazaki |

FOREIGN PATENT DOCUMENTS

| | | |
|---|---|---|
| EP | 0 989 614 | 3/2000 |
| EP | 0 993 235 | 4/2000 |
| EP | 1 003 223 | 5/2000 |
| EP | 1 006 587 | 6/2000 |
| EP | 1 049 176 | 11/2000 |
| JP | 03-259264 | 11/1991 |
| JP | 04-087187 | 3/1992 |
| JP | 05-335242 | 12/1993 |
| JP | 09-007770 | 1/1997 |
| JP | 09-245965 | 9/1997 |
| JP | 10-268360 | 10/1998 |
| JP | 11-031587 | 2/1999 |
| JP | 11-143379 | 5/1999 |
| JP | 11-224781 | 8/1999 |
| JP | 11-271753 | 10/1999 |
| JP | 2000-091626 | 3/2000 |
| JP | 2000-106279 | 4/2000 |
| JP | 2000-156504 | 6/2000 |
| JP | 2000-164347 | 6/2000 |
| JP | 2000-172198 | 6/2000 |
| JP | 2000-294378 | 10/2000 |
| JP | 2001-013893 | 1/2001 |
| JP | 2001-033765 | 2/2001 |
| JP | 2001-512145 | 8/2001 |
| WO | WO 99/48338 | 9/1999 |

OTHER PUBLICATIONS

Tetsuo Tsutsui et al., "High Quantum Efficiency in Organic Light-Emitting Devices with Iridium-Complex as a Triplet Emissive Center," Japanese Journal of Applied Physics, vol. 38, (1999), pp. L1502-L1504.

D. F. O'Brien et al., "Improved Energy Transfer in Electrophosphorescent Devices," 1999 American Institute of Physics, Applied Physics Letters, vol. 74, No. 3, pp. 442-444.

* cited by examiner

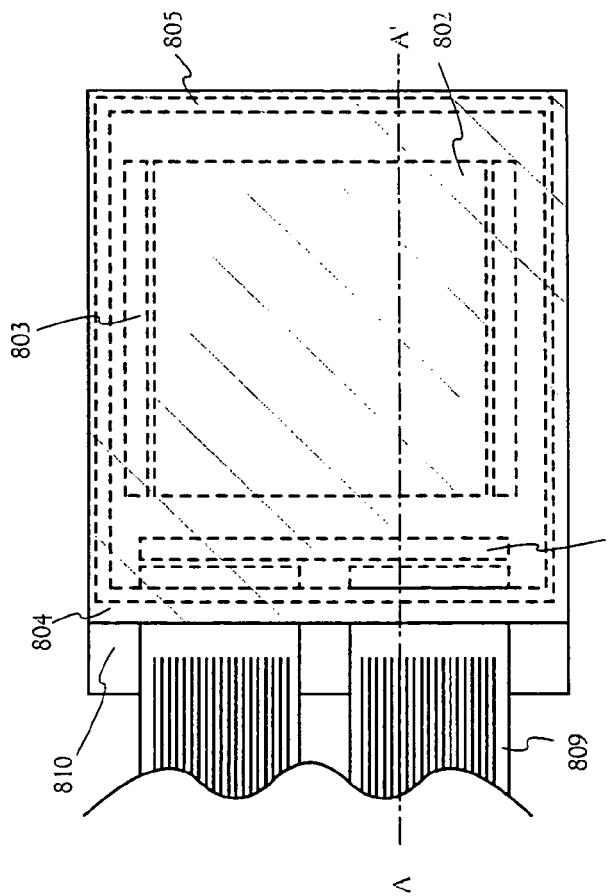
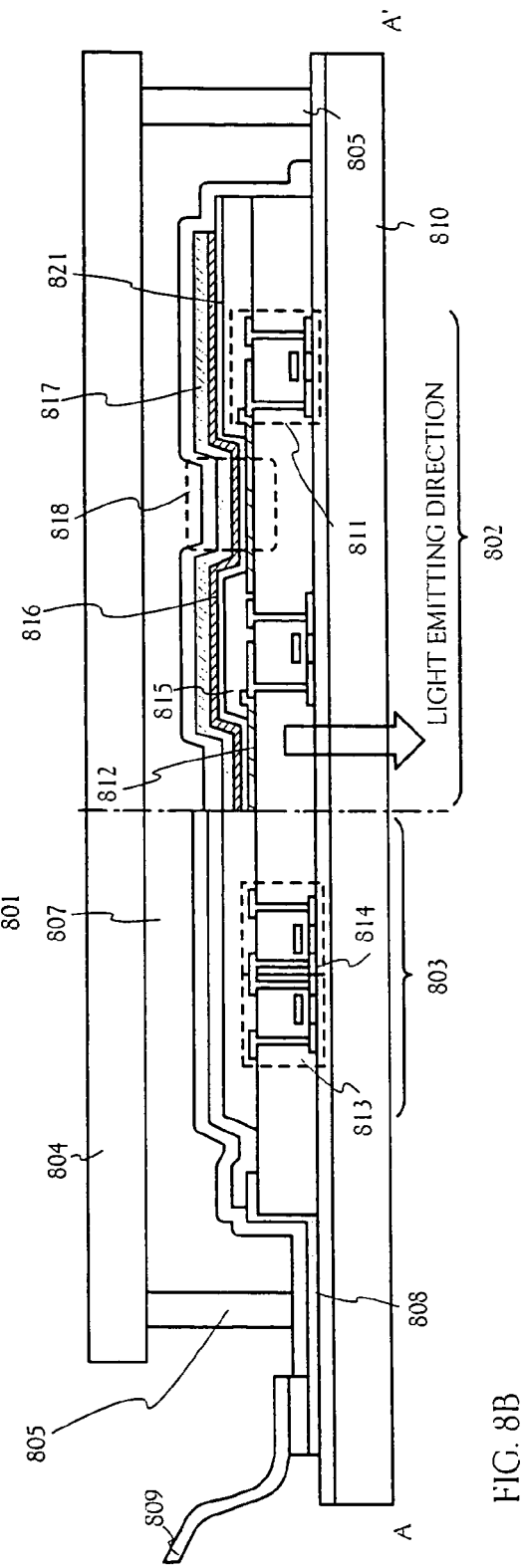
FIG. 8A
FIG. 8B

Before ITO Surface Cleaning

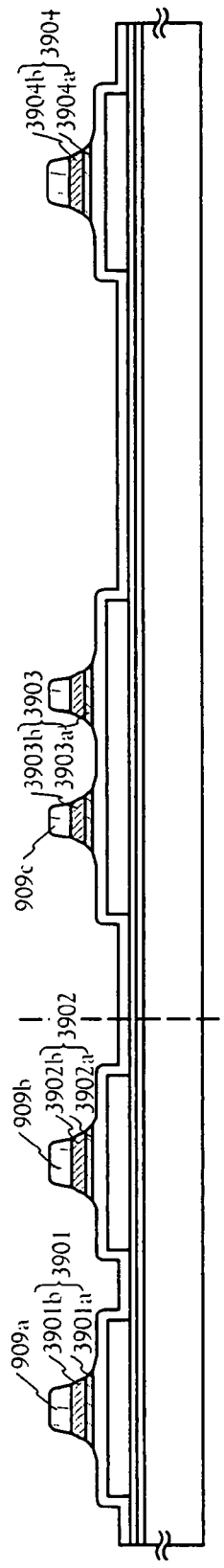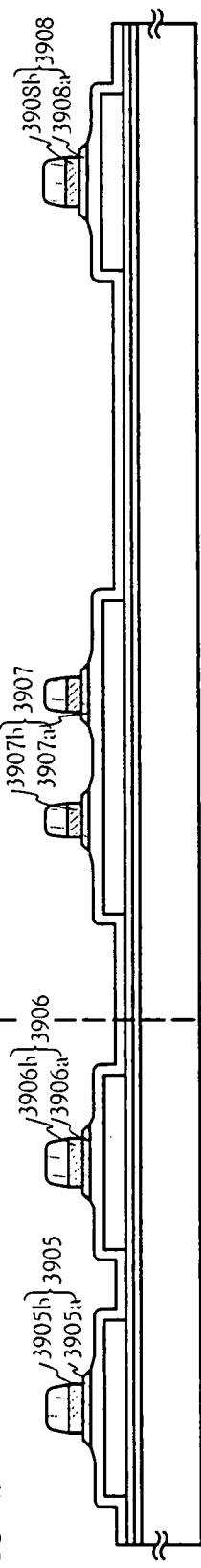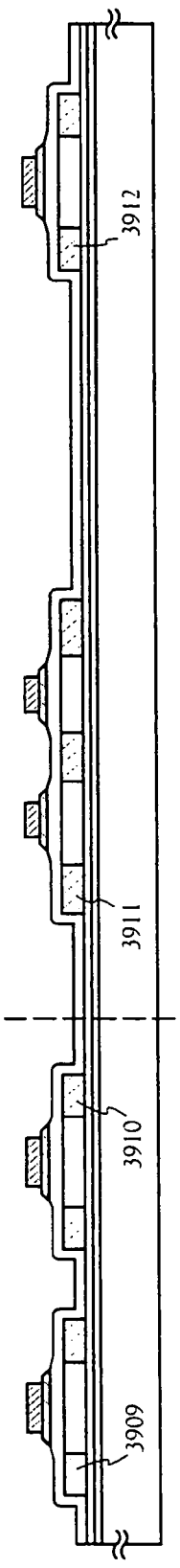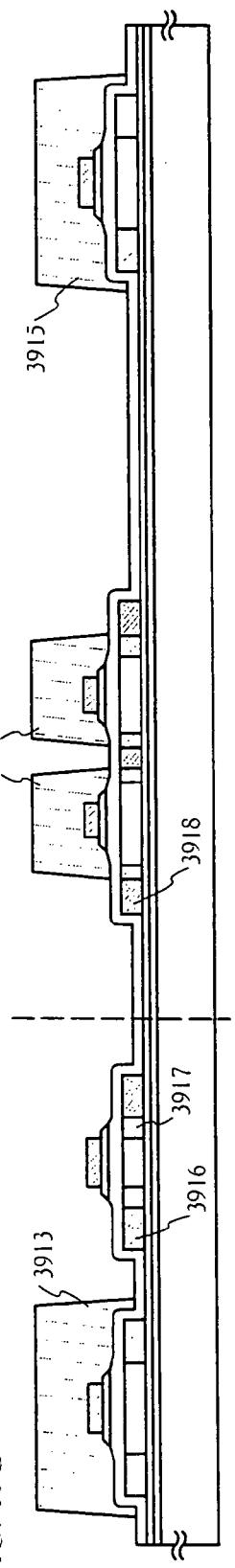
FIG. 19A
FIG. 19B
FIG. 19C
FIG. 19D

LIGHT EMITTING DEVICE

BACKGROUND OF THE INVENTION

1. Field of the Invention

The present invention relates to a light emitting device using a light emitting element with a film containing an organic compound that emits light with application of electric field (hereinafter referred to as organic compound layer), as well as an anode and a cathode. Specifically, the present invention relates to a light emitting device using a light emitting element with lower drive voltage than before and longer lifetime. The term "light emitting device" in this specification refers to an image display device or a light emitting device that employs as a light emitting element a light emitting element. Also included in the definition of the light emitting device are a module in which a connector, such as an anisotropic conductive film (FPC: flexible printed circuit), a TAB (tape automated bonding) tape, or a TCP (tape carrier package), is attached to an organic light emitting element, a module in which a printed wiring board is provided on the tip of a TAB tape or a TCP, and a module in which an IC (integrated circuit) is mounted directly to an organic light emitting element by the COG (chip on glass) method.

2. Description of the Related Art

Light emitting elements are now the focus for next generation flat panel display elements due to their thinness, light weight, high speed response, direct current low voltage drive, and other properties. Further, the light emitting elements are self light emitting, have a wide field of view, and therefore have relatively good visibility. They are considered to be effective as elements used in the display screens of electronic equipment, and are being vigorously developed.

The light emitting mechanism of a light emitting element that emits light by the application of an electric field is considered to be one in which, by sandwiching organic compound layers between electrodes and applying a voltage thereto, electrons injected from a cathode recombine with holes injected from an anode within an organic compound layer, at a center of light emission, forming molecular excitons. The molecular excitons then irradiate energy when returning to a ground state, and light is emitted. Note that a singlet excitation state and a triplet excitation state are possible as molecular exciton types formed by the organic compound, and cases of light being emitted by both types of excitation state are included in this specification.

The light emitting elements are divided by driving method into passive matrix (simple matrix) and active matrix types. Note that active matrix types are particularly in the spotlight because high definition display having pixels equal to or greater than QVGA is possible.

An active matrix light emitting device having light emitting elements has an element structure like that shown in FIG. 2. A current control TFT (thin film transistor) 202 is formed on a substrate 201, and an interlayer insulating film 203 is formed on the TFT 202.

An anode (pixel electrode) 205 which is electrically connected to the TFT 202 by a wiring 204 is then formed on the interlayer insulating film 203. Transparent conductive materials having a high work coefficient are suitable as materials for forming the anode 205, and materials such as ITO (indium tin oxide), tin oxide ($SnO_2$), an alloy made from indium oxide and zinc oxide (ZnO), a half transparent film of gold, and polyaniline are proposed. Among these materials, ITO has a band gap of 3.75 eV, and possesses high transparency in the visible light region, and therefore is most often used.

An organic compound layer 206 is formed on the anode 205. Note that all layers formed between an anode and a cathode are defined as the organic compound layer in this specification. Specifically, light emitting layers, hole injecting layers, electron injecting layers, hole transporting layers, electron transporting layers, and the like are included in the organic compound layer 206. Basically, light emitting elements have a structure in which an anode, a light emitting layer, and a cathode are laminated in order. In addition, light emitting elements may also use structures such as one having an anode, a hole injecting layer, a light emitting layer, and a cathode laminated in order, and one having an anode, a hole injecting layer, a light emitting layer, an electron transporting layer, and a cathode laminated in order.

A light emitting element 209 is formed by forming a cathode 207 after forming the organic compound layer 206. Metals having a small work coefficient are often used as cathodes (typically metals residing in group 1 or group 2 of the periodic table). Note that these types of metals (including alkaline metals and alkaline earth metals) are referred to as "alkaline metals" in this specification.

Further, a bank 208 made from an organic resin material is formed so as to cover edge portions of the anode in order to prevent short circuits between the cathode and the anode in the edge portions.

Note that, although only the light emitting element formed in one pixel is shown in FIG. 2, in practice, a plurality thereof are formed in a pixel portion to thereby produce an active matrix type light emitting device.

The anode is an electrode for injecting holes that participate in light emission in the organic compound layer, and it is thought that cracks developing in the anode may adversely influence the generation of holes, may reduce the number of holes injected, and in addition, may become a cause of deterioration of the light emitting element itself. Roughness on an anode surface is thought to exert an adverse influence on the generation and injection of holes, to reduce the number of holes injected, and to cause deterioration of the light emitting element itself due to cracks.

In addition, the organic compound layers easily deteriorate due to oxygen and moisture, and organic resin materials such as polyimide, polyamide, and acrylic are often used as interlayer insulating films. There is a problem in that the light emitting elements deteriorate due to gases such as oxygen generated from interlayer insulating films formed by the aforementioned materials.

SUMMARY OF THE INVENTION

An object of the present invention is to provide a method of manufacturing a high quality light emitting device in which light emitting elements having long life are manufactured by resolving the above-stated problems by using light emitting elements having a structure that deteriorates less easily than conventional structures.

With the present invention, it is characterized in that an interlayer insulating film made from an inorganic insulating film is formed on a TFT which is formed on an insulator, the interlayer insulating film is made level by using a CMP method, a wiring is then formed, an anode which is electrically connected to the TFT through the wiring is formed, a resin insulating film is formed covering the anode and the wiring, a bank is then formed by etching, surface modification of the bank is performed by plasma processing, the anode is wiped clean, an insulating film is formed covering the anode and the bank, and an organic compound layer is formed on the insulating film.

Note that the problem of deterioration of the light emitting element by the generation of moisture and gasses can be resolved because the interlayer insulating film is formed by an inorganic insulating film.

Further, the insulating film made from silicon nitride or a DLC (diamond like carbon) film is formed on the interlayer insulating film, and therefore alkaline metals used when forming the light emitting elements can be prevented from penetrating into the TFT side.

In addition, unevenness on the surface of the anode is made level by cleaning the anode, and debris on the anode surface can be removed.

Further, a balance regulating effect can be expected for the amount of holes and electrons injected into the organic compound layer by the formation of the insulating film, covering the anode and the bank.

Another structure of the present invention is characterized in that an electric charge preventing film is formed after forming a resin insulating film in order to form a bank, and a bank is then formed by removing the electric charge preventing film and etching the resin insulating film after moving the structure to a processing chamber where contaminants such as alkaline metals can he avoided.

In the above structure of the present invention, it is characterized in that the electric charge preventing film is one capable of being removed by washing with water.

Further, another structure of the present invention is characterized by comprising a step of plasma processing on a surface of a bank, after the bank is formed and an anode is heat treated, performing crystallization.

The deterioration of the light emitting element by emission of moisture from the bank can thus be prevented by performing plasma processing on the bank surface, modifying the surface, and forming a hardened film.

BRIEF DESCRIPTION OF THE DRAWINGS

FIGS. 8A and 8B are diagrams showing a sealed structure of a light emitting device of Embodiment 6;

FIGS. 19A to 19D are diagrams showing an example of a method of manufacturing a light emitting device of Embodiment 2;

DETAILED DESCRIPTION OF THE PREFERRED EMBODIMENTS

Embodiment Mode

Figure 1A:
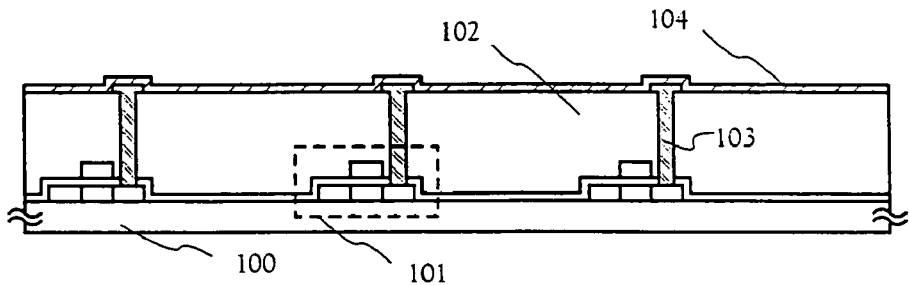
FIGS. 1A to 1E are diagrams showing of a method of manufacturing a light emitting device of the present invention.

A TFT 101 is formed on a substrate 100. The TFT shown here is a TFT for controlling electric current flowing in a light emitting element, and is referred to as the electric current control TFT 101 throughout this specification (FIG. 1A).

An interlayer insulating film 102 is formed next on the electric current control TFT 101, performing leveling. An inorganic insulating film, typically a silicon oxide film, a silicon nitride oxide film, a silicon oxide nitride film, or a lamination film of a combination of these films is formed as the interlayer insulating film 102 by using plasma CVD or sputtering.

Next, the interlayer insulating film 102 is polished by a technique referred to as CMP (chemical mechanical polishing) in order to perform leveling of the surface of the interlayer insulating film 102. CMP is performed such that the average film thickness of the interlayer insulating film after the leveling process is completed is formed to be on the order of 1.0 to 2.0 µm. Further, an insulating film made from a silicon nitride film or a DLC (diamond like carbon) film may also be formed on the interlayer insulating film 102 after performing the leveling process.

A resist mask is formed next having a predetermined pattern, a contact hole for reaching a drain region of the electric current control TFT 101 is formed, and a wiring 103 is formed. In addition to using Al and Ti as conductive metallic films for the wiring material, an alloy of the two may also be used. The wiring may be patterned into a predetermined shape after being formed by sputtering or vacuum evaporation.

A transparent conductive film 104 that becomes an anode of the light emitting element is formed next. Typically, a transparent conductive film of indium tin oxide (ITO), or indium oxide into which 2 to 20% of zinc oxide (ZnO) is mixed, is used as the transparent conductive film 104.

Figure 1B:
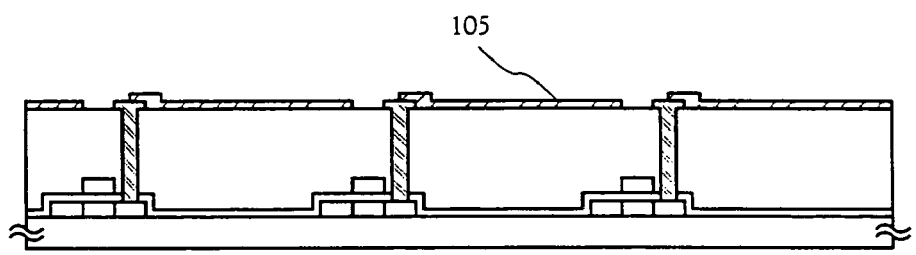
Figure 1C:
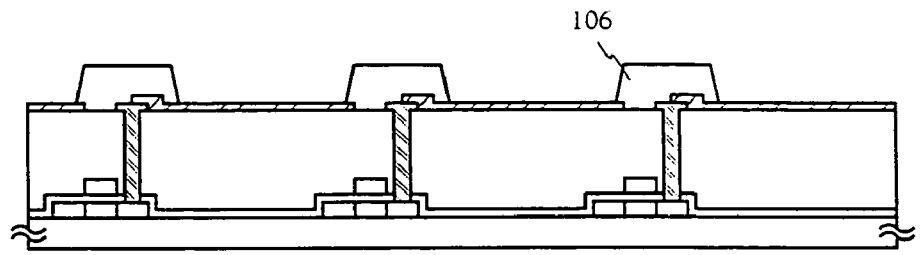

The transparent conductive film 104 is then etched, forming an anode 105 (FIG. 1B). A bank 106 is formed next, and heat treatment processing is performed at a temperature of 230 to 350° C. Note that an insulating film having an opening portion over an anode and formed covering edge portions of the anode is referred to as a bank in this specification (FIG. 1C).

Figure 1D:
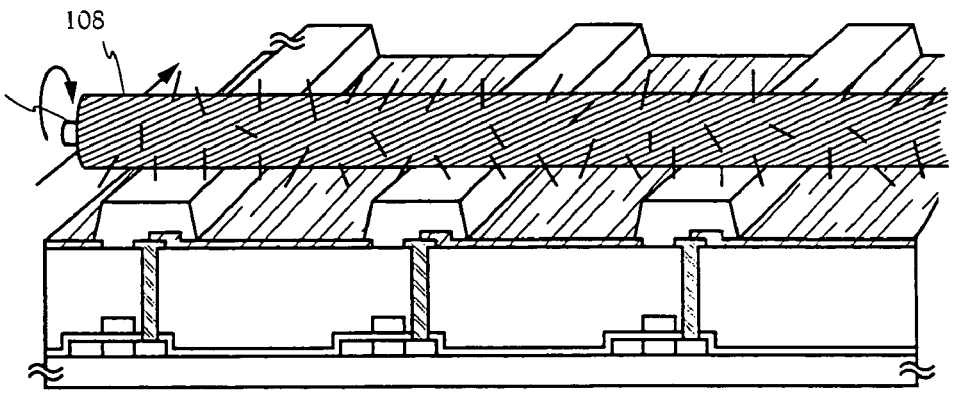
Figure 1E:
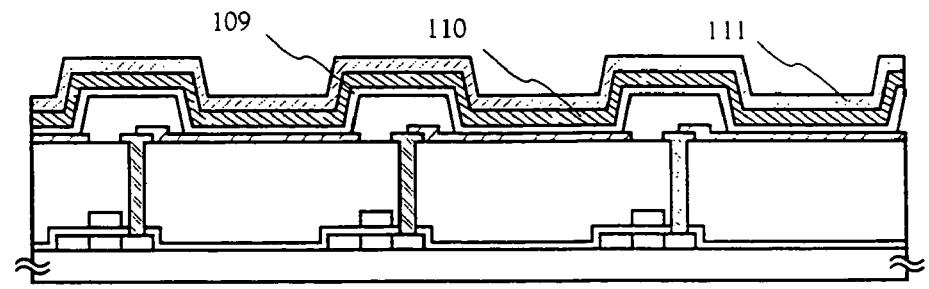
Figure 2:
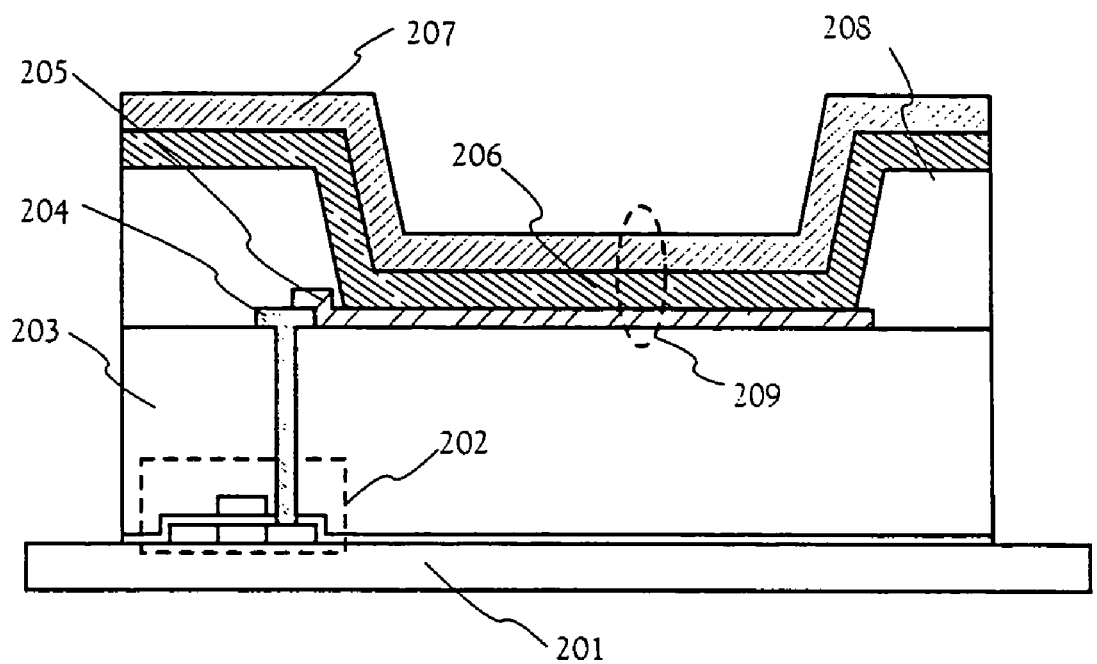
FIG. 2 is a diagram showing an example of a conventional light emitting device.

The surface of the anode 105 is then wiped using a cleaning liquid and a PVA (polyvinyl alcohol)-based porous material 108, performing leveling of the surface of the anode 105 and removal of debris and the like. Note that the process of wiping, the anode surface using a PVA (polyvinyl alcohol)-based porous medium or the like, performing leveling and removal of debris, is referred to as wiping clean within this specification. Note, reference numeral 107 denotes an axis (FIG. 1D).

An insulating film 109 is formed after wiping clean processing of the anode surface. The insulating film 109 is formed from an organic resin film selected from the group consisting of polyimide, polyamide, and acrylic, and is formed at a film thickness of 1 to 5 nm using spin coating.

An organic compound layer 110 is formed on the insulating film 109, and a cathode 111 is formed. The organic compound layer 110 is formed by combining and laminating a plurality of layers. In addition to a light emitting layer, a hole injecting layer, a hole transporting layer, a hole blocking layer, an electron transporting layer, an electron injecting layer, and a buffer layer may be used. It is preferable that the film thickness of the organic compound layer 110 be on the order of 10 to 400 nm (FIG. 1D).

The cathode 111 is formed by evaporation after forming the organic compound layer 110. In addition to MgAg and an Al—Li alloy (aluminum and lithium alloy), a film formed by co-evaporation of an element residing in Group 1 or Group 2 of the periodic table with aluminum may also be used as a material for the cathode 111. Note that it is preferable that the film thickness of the cathode 111 be on the order of 80 to 200 nm.

Figure 13:
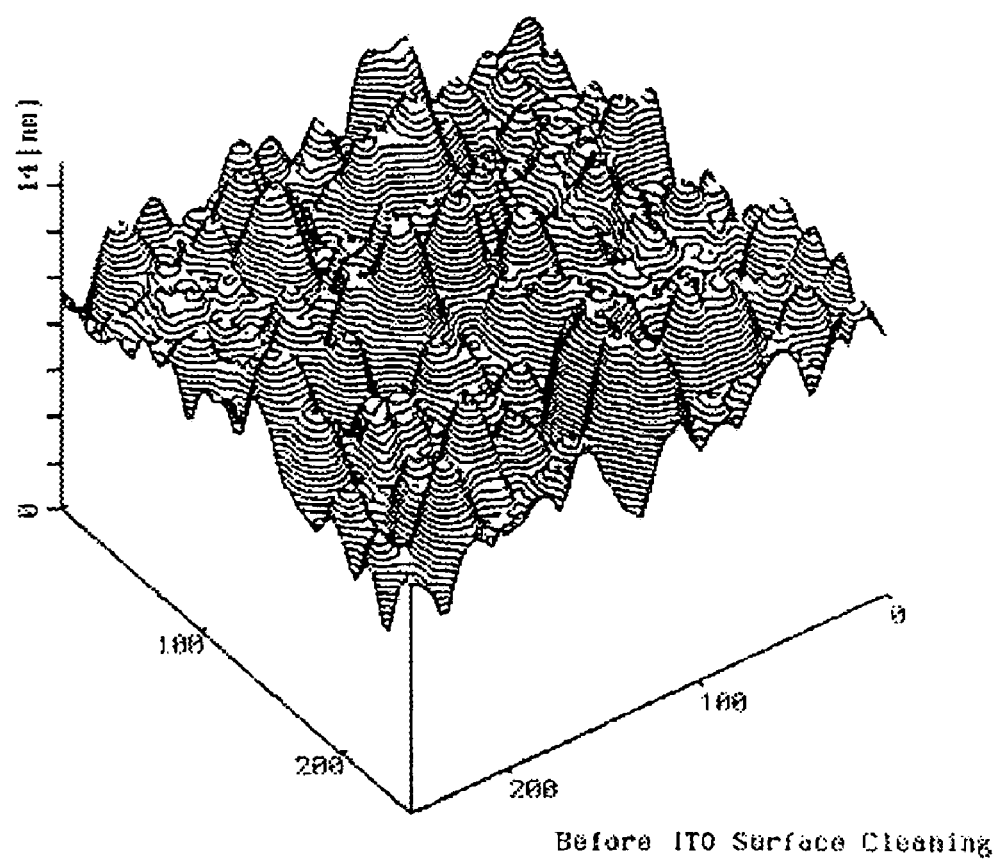
FIG. 13 is a diagram showing results of measuring by AFM of the present invention.
Figure 14:
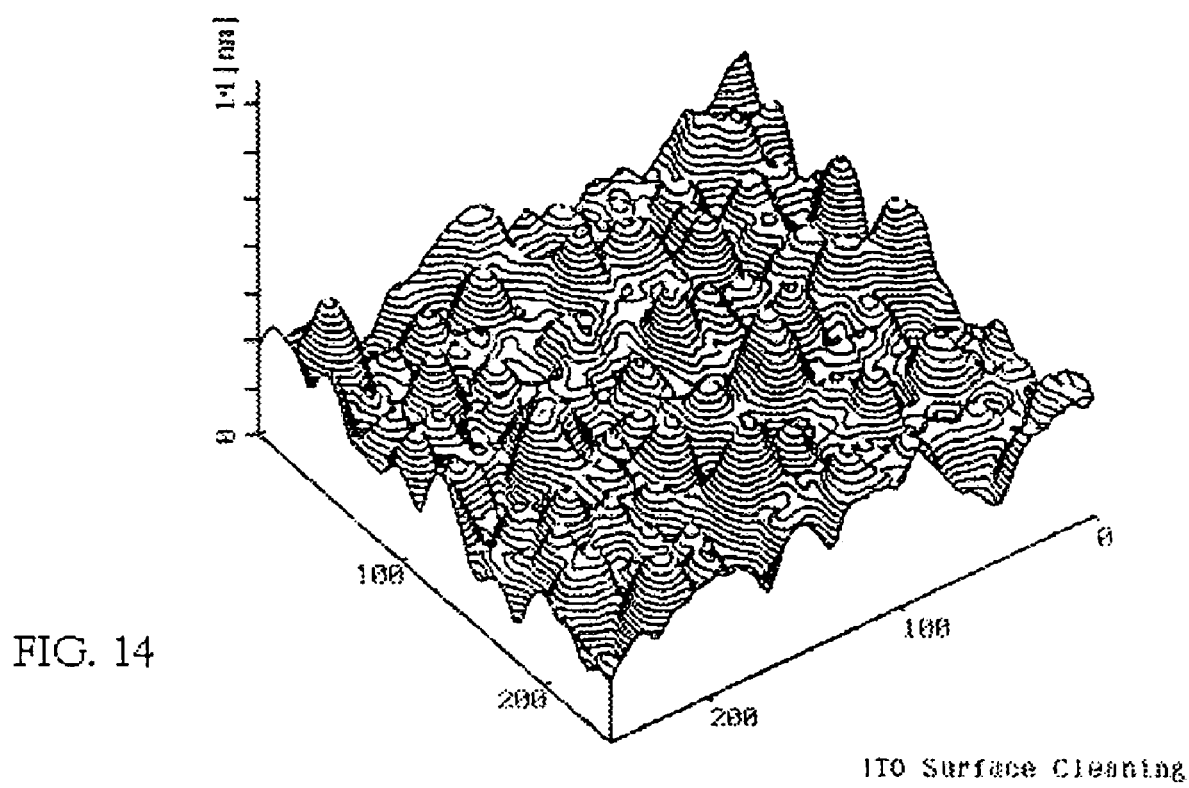
FIG. 14 is a diagram showing results of measuring by AFM of the present invention.
Figure 15:
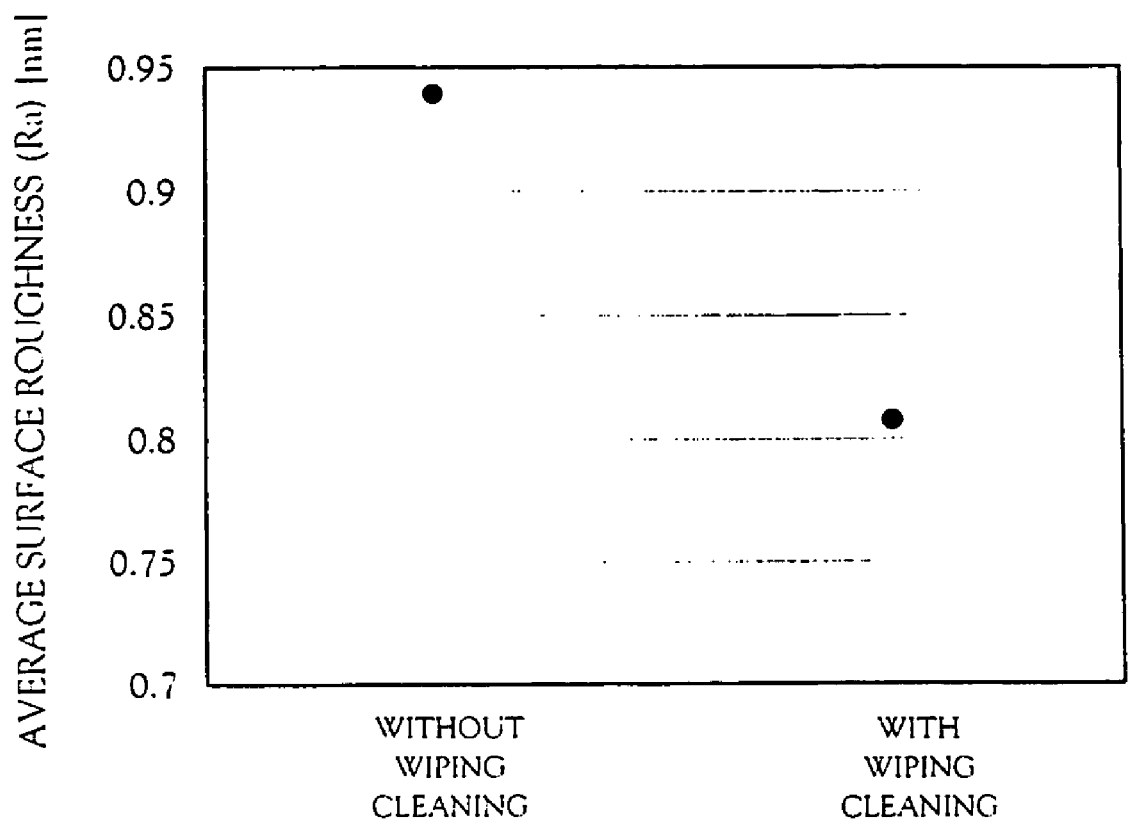
FIG. 15 is a diagram showing results of measuring by AFM of the present invention.

Results of performing surface observation using an atomic force microscope (AFM) of the state of the surface of the transparent conductive film after performing the wiping clean process are shown in FIGS. 13 to 15.

Note that the surface observations in the embodiment mode are made using a 110 nm thick ITO film formed on a glass substrate and crystallized by performing heat treatment at 250° C. as a measurement surface.

The state of unevenness of the substrate surface observed by AFM is shown in FIG. 13 and in FIG. 14. Note that the results of observing the measurement surface before wiping clean processing are shown in FIG. 13, while the results of observing the measurement surface after wiping clean processing are shown in FIG. 14.

FIG. 15 shows the average surface roughness (Ra) before and after a wiping clean process using Bellclean (made by Ozu Corporation) as a PVA-based porous material for the wiping clean process. Note that the average surface roughness used here is the average centerline roughness defined by JIS (Japanese Industrial Standard) B0601 expanded three dimensionally so as to be capable of being applied to the surface. As shown in FIG. 15, the average surface roughness (Ra) of the anode 105 is preferably 0.9 nm or less, more preferably 0.85 nm or less. It can be seen from the results that the average surface roughness in the measurement surface becomes smaller, and that the levelness increases, after the wiping clean process.

Embodiment 1

In this embodiment, the light emitting element formed by using the present invention is explained. Described next is an example of a method of manufacturing, at the same time over the same substrate, TFTs for a pixel portion having an organic light emitting element of the present invention and TFTs (an n-channel TFT and a p-channel TFT) for a driver circuit that is provided in the periphery of the pixel portion. The description will be given with reference to FIGS. 3A to 6C.

First, this embodiment uses a substrate 900 made of barium borosilicate (glass, typically Corning #7059 glass and #1737 glass (products of Corning Incorporated), or alumino borosilicate glass. No limitation is put to the material of the substrate 900 as long as it is light-transmissive (translucent), and a quartz substrate may be used. A plastic substrate may also be used if it can withstand heat at the process temperature of this embodiment.

Figure 3A:
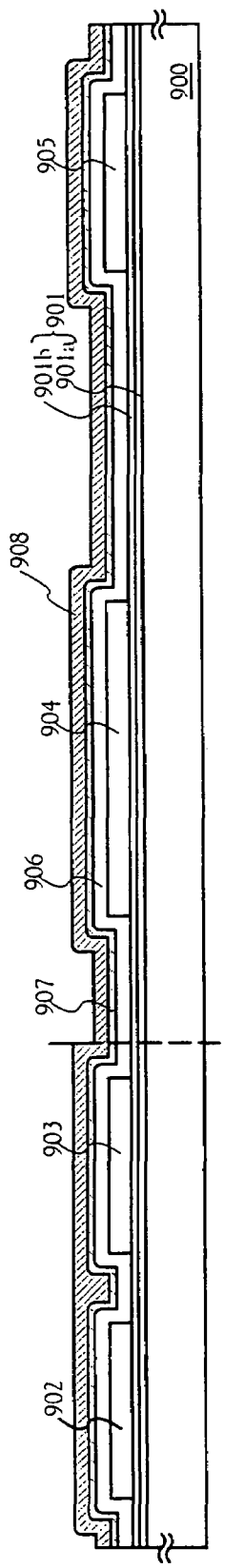
FIGS. 3A to 3D are diagrams showing a process of manufacturing a light emitting device Embodiment 1.

Next, as shown in FIG. 3A, a base film 901 is formed on the substrate 900 from an insulating film such as a silicon oxide film, a silicon nitride film, and a silicon oxynitride film. In this embodiment, the base film 901 has a two-layer structure but it may be a single layer or a laminate of the above insulating films. The first layer of the base film 901 is a silicon oxynitride film 901a formed by plasma CVD using as reaction gas $SiH_4$, $NH_3$, and $N_2O$ to have a thickness of 10 to 200 nm (preferably 50 to 100 nm). In this embodiment, the silicon oxynitride film 901a (composition ratio: Si=32%, O=27%, N=24%, H=17%) is 50 nm in thickness. The second layer of the base film 901 is a silicon oxynitride film 901b formed by plasma CVD using as reaction gas $SiH_4$ and $N_2O$ to have a thickness of 50 to 200 nm (preferably 100 to 150 nm). In this embodiment, the silicon oxynitride film 901b (composition ratio: Si=32%, O=59%, N=7%, H=2%) is 100 nm in thickness.

On the base film 901, semiconductor layers 902 to 905 are formed. The semiconductor layers 902 to 905 are formed by patterning into a desired shape a crystalline semiconductor film that is obtained by forming a semiconductor film with an amorphous structure through a known method (sputtering, LPCVD, or plasma CVD) and then by subjecting the amorphous film to a known crystallization treatment (laser crystallization, thermal crystallization, or thermal crystallization using nickel or other catalyst). The semiconductor layers 902 to 905 are each 25 to 80 nm in thickness (preferably 30 to 60 nm). Although the material of the crystalline semiconductor film is not limited, silicon, silicon (germanium ($Si_x Ge_{1-x}$ (X=0.0001 to 0.02)) alloy or the like is preferred. In this embodiment, an amorphous silicon film with a thickness of 55 nm is formed by plasma CVD and then a solution containing nickel is held to the top face of the amorphous silicon film. The amorphous silicon film is dehydrated (at 500° C. for an hour), then subjected to thermal crystallization (at 550° C. for four hours), and then subjected to laser annealing treatment for improving crystallinity, thereby obtaining the crystalline silicon film. The crystalline silicon film receives patterning treatment by photolithography to form the semiconductor layers 902 to 905.

After the semiconductor layers 902 to 905 are formed, the semiconductor layers 902 to 905 may be doped with a minute amount of impurity element (boron or phosphorus) in order to control the threshold of the TFTs.

If laser crystallization is used to form the crystalline semiconductor film, a pulse oscillation type or continuous wave type excimer layer, YAG laser, or $YVO_4$ laser may be used. When using these lasers, it is appropriate to use an optical system to collect laser light emitted from the laser oscillator into a linear beam before irradiating the semiconductor film. Although conditions of crystallization can be chosen suitably by an operator, preferred conditions are as follows. When an excimer laser is used, the pulse oscillation frequency is set to 300 Hz and the laser energy density is set to 100 to 400 $mJ/cm^2$ (typically, 200 to 300 $mJ/cm^2$). When a YAG laser is employed, the second harmonic thereof is used, the pulse oscillation frequency is set to 30 to 300 kHz, and the laser energy density is set to 300 to 600 $mJ/cm^2$ (typically, 350 to 500 $mJ/cm^2$) The laser light collected into a linear shape is 100 to 1000 μm in width, 400 μm, for example, and the entire surface of the substrate is irradiated with the beam. The overlapping ratio of the linear laser light during irradiation is set to 50 to 90%.

Next, a gate insulating film 906 is formed to cover the semiconductor layers 902 to 905. The gate insulating film 906 is an insulating film containing silicon and formed by plasma CVD or sputtering to have a thickness of 40 to 150 nm. In this embodiment, a silicon oxynitride film (composition ratio: Si=32%, O=59%, N=7%, H=2%) with a thickness of 110 nm is formed by plasma CVD. The rate insulating film is not limited to the silicon oxynitride film, of course, and may be a single layer or a laminate of other insulating films containing silicon.

When a silicon oxide film is used, plasma CVD is employed in which electric discharge is made using a mixture of TEOS (tetraethyl orthosilicate) and $O_2$ and setting the reaction pressure to 40 Pa, the substrate temperature to 300 to 400° C., and the high frequency (13.56 MHz) power density to 0.5 to 0.8 W/cm$^2$. The thus formed silicon oxide film can provide excellent characteristics as a gate insulating film if it receives subsequent thermal annealing at 400 to 500° C.

On the gate insulating film 906, a heat resistant conductive layer 907 for forming gate electrodes is formed to have a thickness of 200 to 400 nm (preferably 250 to 350 nm). The heat resistant conductive film 907 may be a single layer or may take a laminate structure having a plurality of layers, such as a two-layer structure or a three-layer structure, if necessary. The heat resistant conductive layer contains an element selected from the group consisting of Ta, Ti, and W, or an alloy having the above elements as its ingredient, or an alloy film having the above elements in combination. The heat resistant conductive layer is formed by sputtering or CVD. In order to lower the resistance, the concentration of impurities contained in the layer is preferably reduced. The oxygen concentration in particular, is preferably 30 ppm or less. In this embodiment, a W film with a thickness of 300 nm is formed. The W film may be formed by sputtering with W as the target, or by thermal CVD using tungsten hexafluoride ($WF_o$). Either way, the W film has to be low in resistance to use it as gate electrodes, and the resistivity of the W film is preferably set to 20 µΩcm or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.9 to 99.9999% is used and a great care is taken not to allow impurities in the air to mix in the W film during formation. As a result, the W film can have a resistivity of 9 to 20 µΩcm.

The heat resistant conductive layer 907 may instead be a Ta film, which similarly can be formed by sputtering. Ar is used as sputtering gas when forming a Ta film. If an appropriate amount of Xe or Kr is added to the sputtering gas, the internal stress of the film to be formed is eased and thus the film is prevented from peeling off. The resistivity of a Ta film in α phase is about 20 µΩcm and is usable for a gate electrode. On the other hand, the resistivity of a Ta film in β phase is about 180 µΩm and is not suitable for a gate electrode. A Ta film in α phase can readily be obtained by forming a TaN film as a base of a Ta film because a TaN film has a crystal structure approximate to that of the a phase Ta film. Although not shown in the drawings, it is effective to form a silicon film doped with phosphorus (P) to have a thickness of about 2 to 20 nm under the heat resistant conductive layer 907. This improves adhesion to the conductive film formed thereon and prevents oxidation of the conductive film and, at the same time, prevents alkaline metal elements contained in a minute amount in the heat resistant conductive layers 907 and 908 from diffusing into the first shape gate insulating film 906. In either case, the resistivity of the heat resistant conductive layer 907 is preferably set to 10 to 50 µΩcm.

In this embodiment, the TaN film and the W film are formed in the first conductive layer (the first conductive film 907) and the second conductive layer (the second conductive film 908) respectively. (FIG. 3A)

Next, resist masks 909 are formed by using the photolithography technique. Then the first etching treatment is conducted. The first etching treatment is conducted by the first etching conditions and the second etching conditions.

In this embodiment, an ICP etching device is employed, $Cl_2$, $CF_4$ and $O_2$ are mixed as etching gas, setting the respective flow rates to 25/25/10 (sccm), and an RF (13.56 MHz) power of 3.2 W/cm$^2$ is given at a pressure of 1 Pa to generate plasma. The substrate side (sample stage) also receives an RF (13.56 MHz) power of 224 mW/cm$^2$ so that a substantially negative self-bias voltage is applied. The W film is etched under the first etching conditions. Then, the first etching conditions are switched to the second etching conditions without removal of the resist masks. The second etching conditions include: using as an etching gas $CF_4$ and $Cl_2$; setting of their gas flow rates to 30/30 (sccm); and giving an RF (13.56 MHz) power at a pressure of 1 Pa to generate plasma. The substrate side (sample stage) also receives an RF (13.56 MHz) power of 20 W so that a substantially negative self-bias voltage is applied.

Figure 3B:
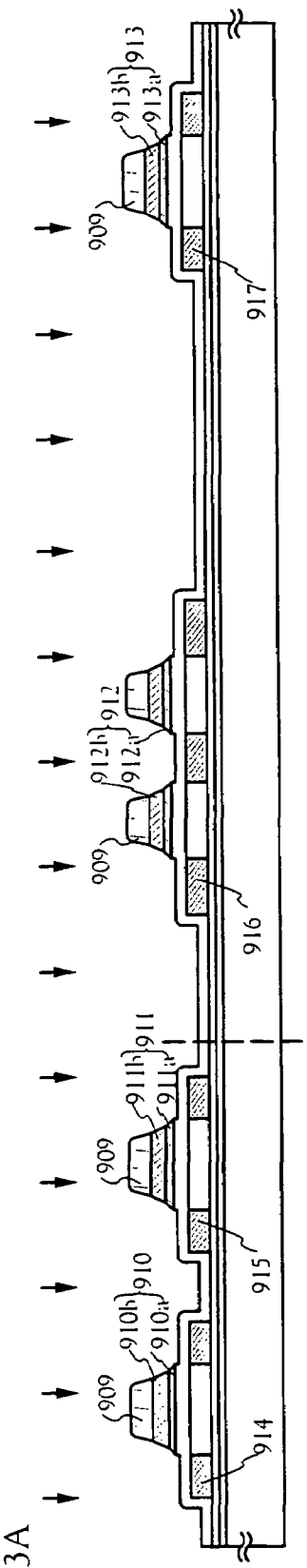

Through the first etching treatment, conductive layers 910 to 913 (first conductive films 910a-913a and second conductive films 910b-913b) having a first taper shape are formed. The angle of the tapered portions of the conductive layers 910 to 913 is 15 to 30°. In order to etch the conductive films without leaving any residue, over-etching is employed in which the etching time is prolonged by about 10 to 20%. The selective ratio of the W film to the silicon oxynitride film (the Kate insulating film 906) is 2 to 4 (typically 3), and therefore a region where the silicon oxynitride film is exposed is etched by about 20 to 50 nm by the over-etching treatment (FIG. 3B).

First doping treatment is conducted next to dope the semiconductor layers with an impurity element of one conductivity type. An impurity element giving the n-type conductivity is used in this doping step without removal of the resist mask 909. The doping of the impurity element imparting the n-type conductivity is conducted by ion doping in a self-aligning manner while using the conductive layers 910 to 913 having the first tapered shape in a part of the semiconductor layers 902 to 905 as masks to form the first n-type impurity element regions 914 to 917. Used as the impurity element that gives the n-type conductivity is an element belonging to Group 15, typically, phosphorus (P) or arsenic (As). Here, phosphorus (P) is used. Through this ion doping, first impurity regions 914 to 917 are formed to contain the impurity element that gives the n-type conductivity in a concentration of $1\times10^{20}$ to $1\times10^{21}$ atoms/cm$^3$ (FIG. 3B).

Figure 3C:
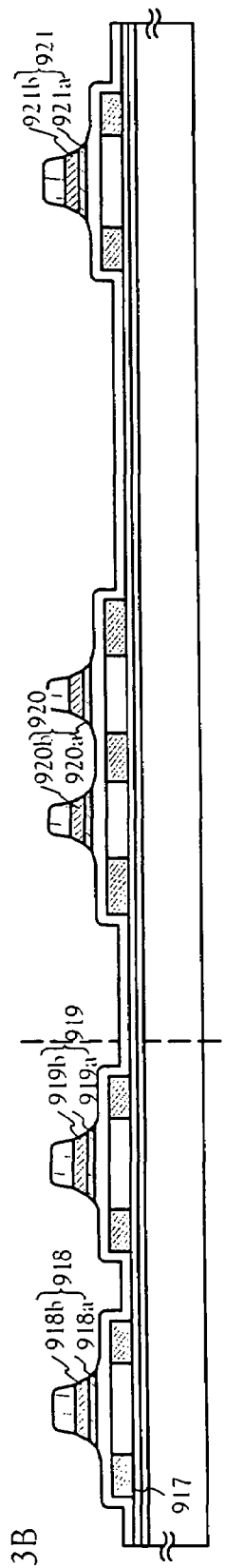

Next, second etching treatment is conducted without removal of the resist mask. The second etching treatment is conducted by the third etching conditions and the fourth etching conditions. The second etching treatment, same as the first etching treatment, include: using as an etching gas $CF_4$ and $Cl_2$ and setting the ratio of their respective floe rates to 30/30 (sccm); and giving an RF (13.56 MHz) power at a pressure of 1 Pa to generate plasma. The substrate side (sample stage) also receives an RF (13.56 MHz) power of 20 W so that a substantially negative self-bias voltage is applied. By the third etching conditions, the conductive films 918 to 921 (918a-921a and 918b-921b) in which the W film and TaN film are etched to about the same extent are formed. (FIG. 3C)

Figure 3D:
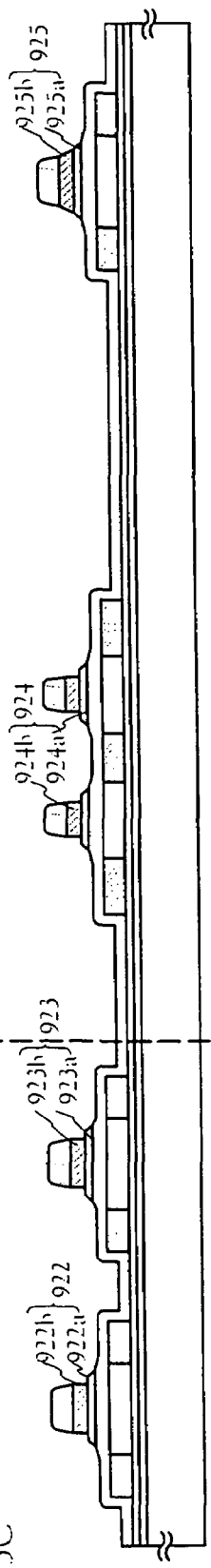

After that, the fourth etching conditions is conducted as the resist mask is remained in its place. In the etching here, an etching gas obtained by mixing, $CF_4$, $Cl_2$ and $O_2$ is used, and an RF (13.56 MHz) power at a pressure of 1 Pa to generate plasma. The substrate side (sample stage) also receives an RF (13.56 MHz) power of 20 W so that a substantially negative self-bias voltage is applied. The W film is etched by the fourth etching conditions to form the second conductive films 922 to 925 (922a-925a and 922b-925b). (FIG. 3D)

Figure 4A:
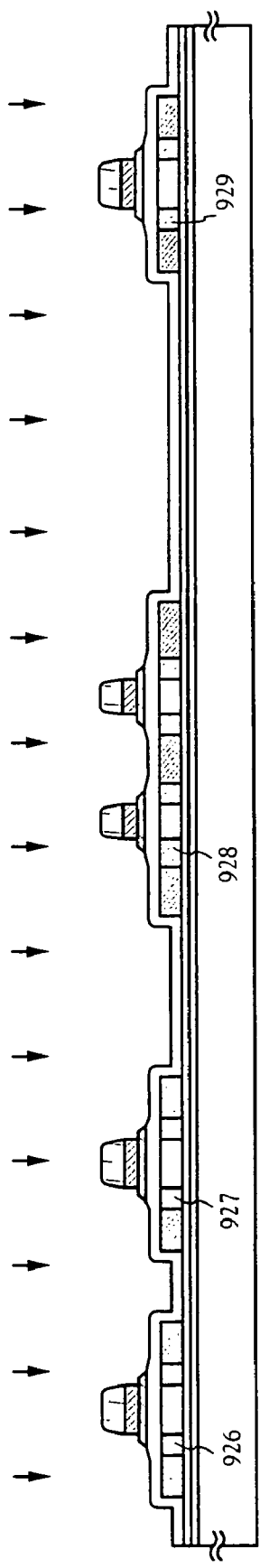
FIGS. 4A to 4C are diagrams showing the process of manufacturing a light emitting device of Embodiment 1.

Next, the second doping process (the doping of the n-type impurity element to the semiconductor layer via the second shape first conductive film 922a to 925a) is conducted, the second n-type impurity regions 926 to 929 is formed at the side of the channel formation region in contact with the first n-type impurity regions 914 to 917. The impurity concentration in the second n-type impurity region is set to $1 \times 10^{16}$ to $1 \times 10^{19}$ atms/cm$^3$. In the second doping process, the conditions is set so as to dope the n-type impurity element to the semiconductor layer even though via the taper portion of the second shape conductive films 922a to 925a of the first layer. In this specification, the second n-type impurity region which is overlapped with the second shape conductive films 922a to 925a and the second n-type impurity region which is not overlapped with the second shape conductive films 922a to 925a are referred to as the Lov ("ov" means "overlapped") and Loff ("off" means "offset") (FIG. 4A).

Figure 4B:
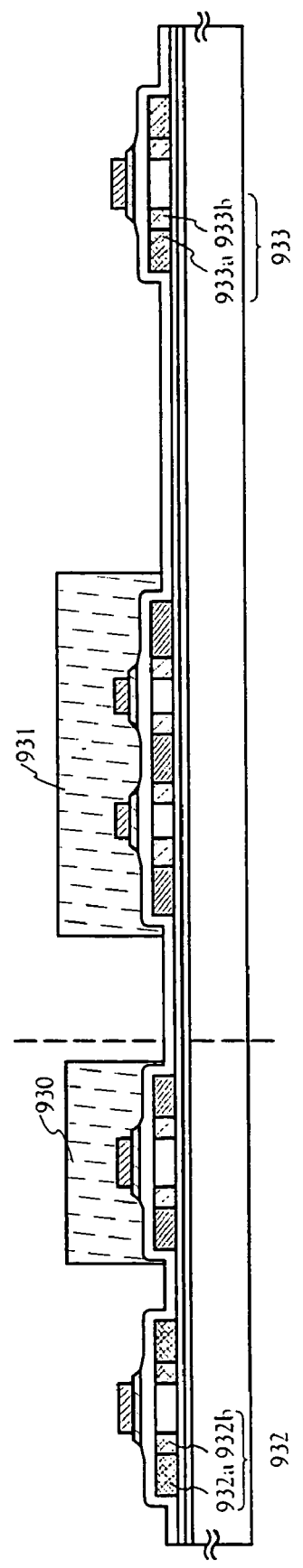

Then as shown in FIG. 4B, impurity regions 932 (932a and 932b) and 933 (933a and 933b) having the conductivity type reverse to the one conductivity type are respectively formed in the semiconductor layers 902 and 905 that are to form p-channel TFTs. In this case also, the semiconductor layers are doped with an impurity element that gives the p type conductivity while using as masks the second shape conductive layers 922 and 925 to form the impurity regions in a self-aligning manner. During this doping, the semiconductor layers 903 and 904 that are to form n-channel TFTs are completely covered with resist masks 930 and 931. The impurity regions 932 and 933 here are formed by ion doping using diborane ($B_2H_6$) The concentration of the impurity element that gives the p type conductivity in the impurity regions 932 and 933 is set to $2 \times 10^{20}$ to $2 \times 10^{21}$ atoms/cm$^3$.

At a closer look, the p-type impurity regions 932 and 933 contain the impurity element that gives the n-type conductivity. However, the p-type impurity regions 932 and 933 have no problem in functioning as a source region and a drain region of p-channel TFTs if they are doped with the impurity element for imparting the p-type conductivity in a concentration 1.5 to 3 times higher than the concentration of the impurity element that gives the n-type conductivity.

Figure 4C:
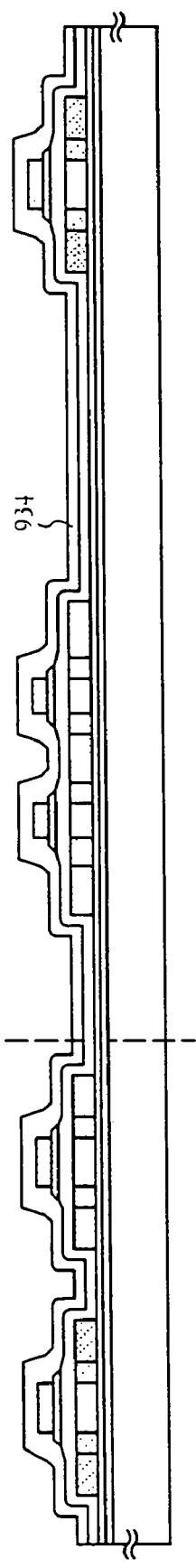

Thereafter, as shown in FIG. 4C, a first interlayer insulating film 934 is formed on the second shape conductive layers 922 to 925 and the gate insulating film 906. The first interlayer insulating film 934 may be a silicon oxide film, a silicon oxynitride film, a silicon nitride film, or a laminate having these films in combination. In either case, the first interlayer insulating film 934 is formed from an inorganic insulating material. The thickness of the first interlayer insulating film 934 is 100 to 200 nm. When a silicon oxide film is used for the first interlayer insulating film 934, plasma CVD is employed in which electric discharge is made using a mixture of TEOS and $O_2$ and setting the reaction pressure to 40 Pa, the substrate temperature to 300 to 400° C., and the high frequency (13.56 MHz) power density to 0.5 to 0.8 W/cm$^2$. When a silicon oxynitride film is used for the first interlayer insulating film 934, one formed by plasma CVD from $SiH_4$, $N_2O$, and $NH_3$, or one formed by plasma CVD from $SiH_4$ and $N_2O$ is chosen. Film formation conditions in this case include setting the reaction pressure to 20 to 200 Pa, the substrate temperature to 300 to 400° C., and the high frequency (60 MHz) power density to 0.1 to 1.0 W/cm$^2$. A silicon oxynitride hydrate film formed from $SiH_4$, $N_2O$, and $H_2$ may also be used as the first interlayer insulating film 934. Similarly, a silicon nitride film can be formed by plasma CVD from $SiH_4$ and $NH_3$.

Then the impurity elements used in doping to give the n-type and p-type conductivities in the respective concentrations are activated. The activation step is carried out by thermal annealing using an annealing furnace. Other activation methods adoptable include laser annealing and rapid thermal annealing (RTA). The thermal annealing is conducted in a nitrogen atmosphere with an oxygen concentration of 1 ppm or less, preferably 0.1 ppm or less, at 400 to 700° C., typically: 500 to 600° C. In this embodiment, the substrate is subjected to heat treatment at 550° C. for four hours. However, if a plastic substrate weak against heat is used for the substrate 900, laser annealing is preferred.

The catalyst element (nickel) used in the process of crystallizing the semiconductor layer is moved (gettered) into the first n-type impurity region to which the element residing in Group 15 of the periodic table (phosphorous in Embodiment 1) and having a gettering action has been added at high concentration. The concentration of the catalyst element in the channel forming region can thus be reduced.

The atmospheric gas is then changed after the activation process, and heat treatment is performed for 1 to 12 hours at 300 to 450° C. in an atmosphere containing between 3 and 100% of hydrogen, performing a process of semiconductor layer hydrogenation. This process is one of terminating from $10^{16}$ to $10^{18}$/cm$^3$ of dangling bonds in the semiconductor layers by hydrogen that is thermally excited. Plasma hydrogenation (using hydrogen excited by a plasma) may also be used as another means of hydrogenation. Whichever method is employed, it is preferable that the fault density within the semiconductor layers 902 to 905 be made equal to or less than $10^{16}$/cm$^3$, and therefore hydrogen on the order of 0.01 to 0.1 atomic % may be imparted.

A second interlayer insulating film 935 is then formed having an average film thickness of 1.0 to 2.0 μm from an inorganic insulating material. A silicon oxide film or a silicon oxynitride film may be formed as the inorganic insulating film using a known sputtering method or plasma CVD method. In addition, the inorganic insulating, film may be formed by plasma CVD using $SiH_4$ and $N_2O$ as raw material gasses if a silicon oxynitride film is used, with film deposition conditions of a pressure of 0.3 torr, a substrate temperature of 400° C., an RF output of 100 W, and raw material gas flow rates of 4 sccm and 400 sccm for $SiH_4$ and $N_2O$, respectively.

Figure 17:
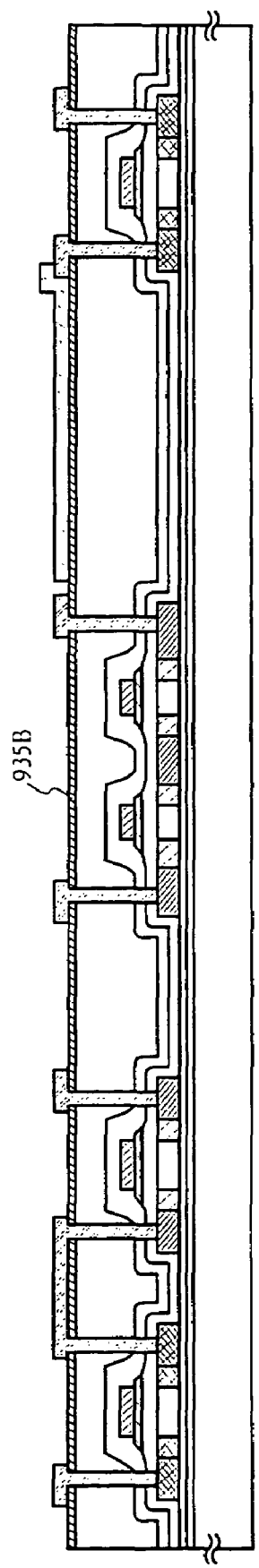
FIG. 17 is a diagram showing an example of a method of manufacturing a light emitting device of Embodiment 1.

The interlayer insulating film is next polished by a technique referred to as CMP (chemical mechanical polishing), performing leveling. CMP is a method in which a surface of a workpiece to be polished is taken as a standard, and chemical and mechanical leveling is performed following the surface. In general, a polishing cloth or a polishing pad (hereafter referred to as a pad in this specification) is attached on a platen or a polishing plate. The platen or polishing plate, and the piece to be polished are then each rotated or oscillated while a slurry is supplied between the workpiece and the polishing pad. Processing of the surface is thus performed by a compound chemical and mechanical action of the surface of the workpiece to be polished. The second interlayer insulating film 935 is polished by CMP after it is formed in Embodiment 1. Known materials may be used for the slurry, the pad, and an apparatus for performing CMP, and the polishing method can also be performed using a known method. Note that polishing is performed such that the average film thickness of the second interlayer insulating film 935 is set on the order of 1.0 to 2.0 μm after the leveling process by CMP is complete. Further, an insulating film 935B made from a silicon nitride film or a DLC film may also be formed on the second interlayer insulating film 935 after it has undergone the leveling process as shown in FIG. 17. It is thought that forming the insulating film 935B can prevent the penetration of alkaline metals, used during formation of the light emitting element, into the TFT side through the interlayer insulating film.

A resist mask having a predetermined pattern is then formed, and contact holes for reaching the impurity regions which are formed in each of the semiconductor layers and made into source regions or drain regions are formed. The contact holes are formed by dry etching.

Wirings 936 to 942 are then formed by forming a conductive metallic film by sputtering or vacuum evaporation, performing patterning using a mask, and then etching the conductive metallic film. Although not shown in the figures, the wirings are formed by a lamination film of a Ti film having a film thickness of 50 nm, and an alloy film (an Al and Ti alloy film) having a film thickness of 500 nm in Embodiment 1.

Figure 5A:
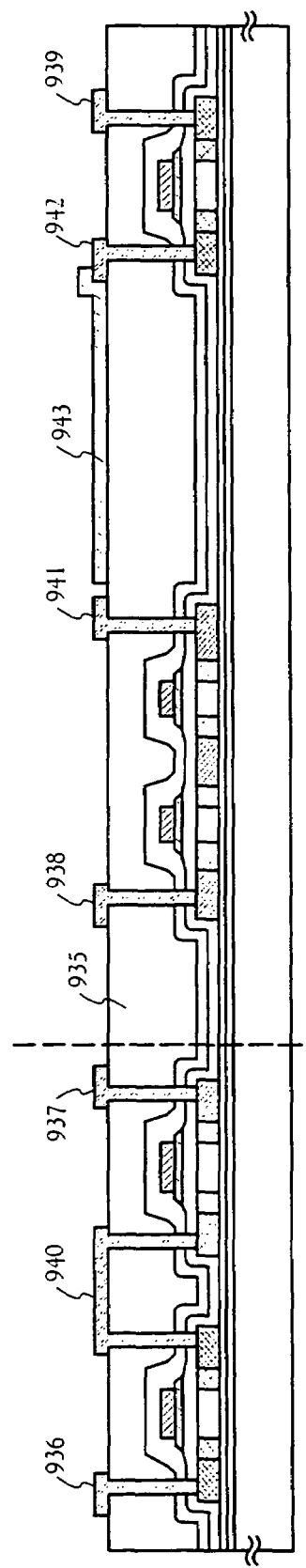
FIG. 5A to 5C are diagrams showing the process of manufacturing a light emitting device of Embodiment 1.

Next, a transparent conductive film is formed thereon having a thickness of 80 to 120 nm, and an anode 943 (a pixel electrode) is formed by etching (see FIG. 5A). Note that an indium tin oxide (ITO) film or a transparent conductive film, in which from 2 to 20% of zinc oxide (ZnO) is mixed with indium oxide, is used as a transparent electrode in Embodiment 1.

Further, an electrical connection with a drain region of the electric current control TFT is formed by forming the anode 943 contacting and overlapping the drain wiring 942. Heat treatment of the anode 943 may also be performed here at a temperature of 180 to 350° C.

Figure 5B:
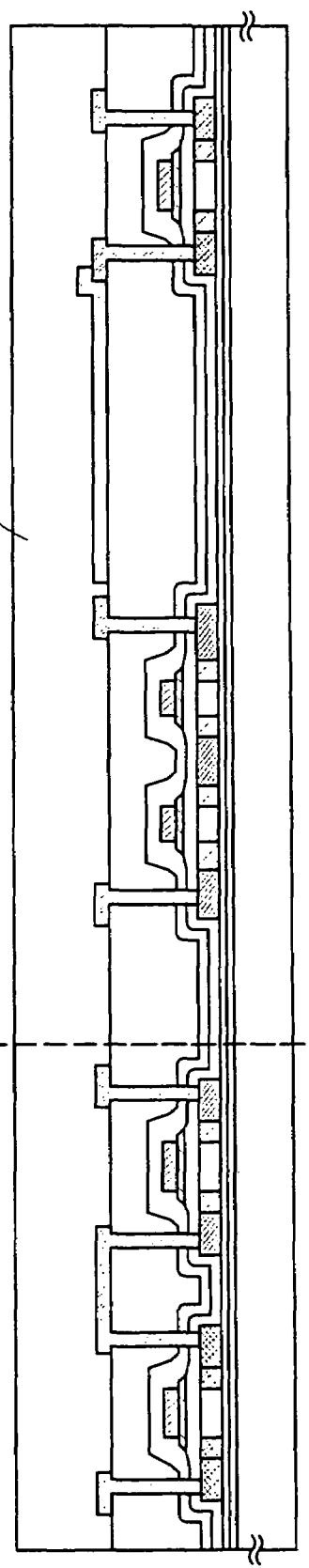
Figure 5C:
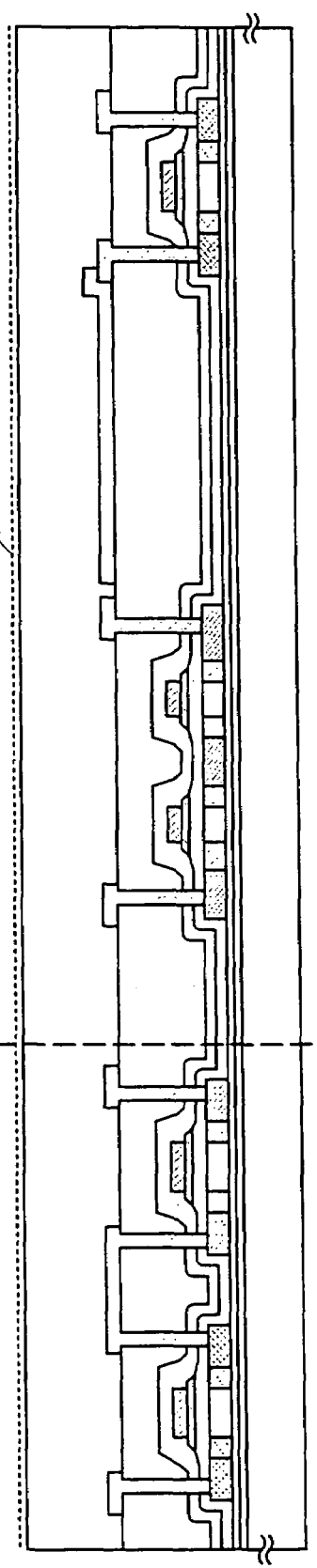

A third interlayer insulating film 944 is formed next on the anode 943, as shown in FIG. 5B. There are times when the substrate is moved to a processing chamber (clean room) in order to form the light emitting elements. An extremely thin film 945 having an electric charge prevention effect (hereafter referred to as an electric charge preventing film) is formed on the third interlayer insulating film 944 so that the TFT substrate is not contaminated by, or damaged by, debris within the atmosphere. The electric charge preventing film 945 is formed from a material capable of being removed by washing with water (see FIG. 5C).

The electric charge preventing film 945 is removed by washing, with water after the TFT substrate is carried into the processing chamber (clean room) for forming the light emitting elements. The third interlayer insulating film 944 is then etched, and a bank 946 having an opening portion in a location corresponding, to a pixel (light emitting element) is formed. The bank 946 is formed using resist in Embodiment 1. With the thickness of the bank 946 on the order of 1 μm, a region covering portions in which the wiring and the anode contact is formed so as to take on a tapered shape in Embodiment 1 (see FIG. 6A)

Note that although a film of resist is used as the bank 946 in Embodiment 1, other materials such as polyimide, polyamide, acrylic, BCB (benzocyclobutene), and a silicon oxide film can also be used. Provided that the bank 946 has insulation properties, both organic and inorganic materials may be used. Note that if a photosensitive acrylic is used to form the bank 946, it is preferable to perform heat treatment at a temperature of 180 to 350° C. after etching a film of the photosensitive acrylic. Furthermore, it is preferable to perform heat treatment at a temperature of 180 to 350° C. and then to perform etching, forming the bank, if the bank is formed using a non-photosensitive acrylic film.

A process of wiping clean the anode surface is performed next. Note that the surface of the anode 943 is made level, and debris adhering to the surface is removed, by wiping the anode 943 surface using Bellclean (made by Ozu Corporation) in Embodiment 1. Pure water is used as a cleaning solution during the wiping clean process, the rotational speed of the axis around which the Bellclean is wrapped is set between 100 and 300 rpm, and the push in value is from 0.1 to 1.0 mm (see FIG. 6A).

An insulating film 947 is formed next, covering the bank 946 and the anode 943. An organic resin film such as polyimide, polyamide, or polyimide amide is formed as the insulating film 947 having a film thickness or 1 to 5 nm using a method such as spin coating, evaporation, or sputtering. Cracks and the like in the surface of the anode 943 can be covered by forming the insulating film, and deterioration of the light emitting elements can be prevented.

An organic compound layer 948 and a cathode 949 are then formed by evaporation on the insulating film 947. Note that although an MgAg electrode is used as the cathode 949 of the light emitting elements in Embodiment 1, other known materials may also be used. Note that the organic compound layer 948 may be formed by combining and laminating a plurality of layers in addition to a light emitting layer, such as a hole injecting layer, a hole transporting layer, an electron transporting layer, an electron injecting layer, and a buffer layer. A detailed explanation is given below regarding the structure of the organic compound layer used in Embodiment 1.

Copper phthalocyanine is used as a hole injecting layer in Embodiment 1, and α-NPD is used as a hole transporting layer. Each is formed by evaporation.

A light emitting layer is formed next, and formation of organic compound layers that emit different types of light is performed by using different materials in the light emitting layer in Embodiment 1. Note that organic compound layers that emit red, green, and blue color light are formed in Embodiment 1. Further, each is formed using evaporation as a deposition method, and therefore it is possible to form the light emitting layers using different materials for each pixel by employing a metal mask during film formation.

The light emitting layer for emitting red color light is formed using $Alq_3$ into which DCM is doped. In addition, materials such as N,N'-disaticylidine-1,6-hexane-diaminate) zinc (II) (Zn(salhn)) into which the Eu complex (1,10-phenanthroline)tris(1,3-diphenyl-propane-1,3-zeonate) europium (III) $(Eu(DBM)_3(Phen)$ is doped can be used, and other known materials can also be used.

Further, CBP and $Ir(ppy)_3$ can be formed by co-evaporation as the green color light emitting layer. Note that it is preferable to laminate a hole blocking layer on the green color light emitting layer using BCP at this time. Further, an aluminum quinolinolate complex $(Alq_3)$ and a benzo-quinolinate beryllium complex (BeBq) can also be used. In addition, it is also possible to use an aluminum quinolinolate complex $(Alq_3)$ into which a material such as cumarin 6 or quinacridone is doped, and other known materials can also be used.

The distyryl derivatives DPVBi; the zinc complex possessing azo-methine compound as a ligand N,N'-disaticylidine-1,6-hexane-diaminate) zinc (II) (Zn(salhn)), into which perylene is doped; and 4,4'-bis(2,2-diphenylvinyl)-biphenyl (DPVBi), into which perylene is doped, can be used as the blue color light emitting layer. Other known materials can also be used.

An electron transporting layer is formed next. Note that materials such as derivatives of 1,3,4-oxadiazole and 1,2,4-triazole (TAZ) can be used as the electron transporting layer. The electron transporting layer is formed from derivatives of 1,2,4-triazole (TAZ) having a film thickness of 30 to 60 using evaporation in Embodiment 1.

The organic compound layer is thus formed from a lamination structure. Note that the film thickness of the organic compound layer 948 may he set from 10 to 400 nm (typically between 60 and 150 nm), and that the thickness of a cathode 949 may be set from 80 to 200 nm (typically between 100 and 150 nm) in Embodiment 1.

The cathode 949 of the light emitting element is formed by evaporation after forming the organic compound layer. MgAg is used as a conductive film that becomes the cathode of the light emitting element in Embodiment 1, and it is also possible to use an Al—Li alloy film (an alloy film of aluminum and lithium), or a film formed by co-evaporation of aluminum and an element residing in Group 1 or Group 2 of the periodic table.

Figure 6A:
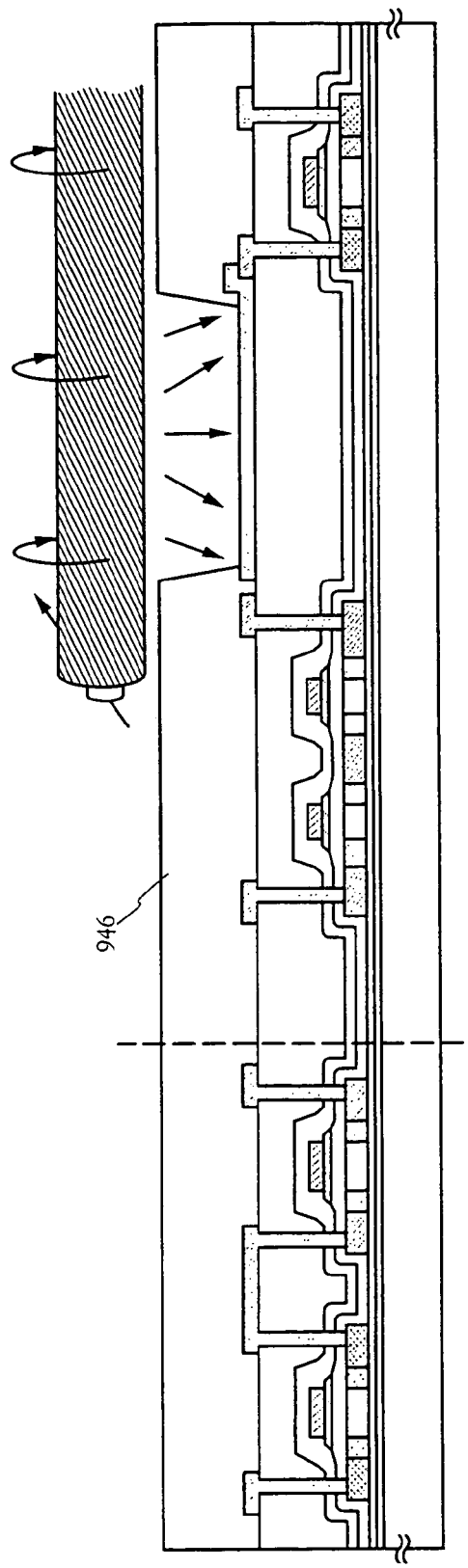
FIGS. 6A and 6B are diagrams showing the process of manufacturing a light emitting device of Embodiment 1.
Figure 6B:
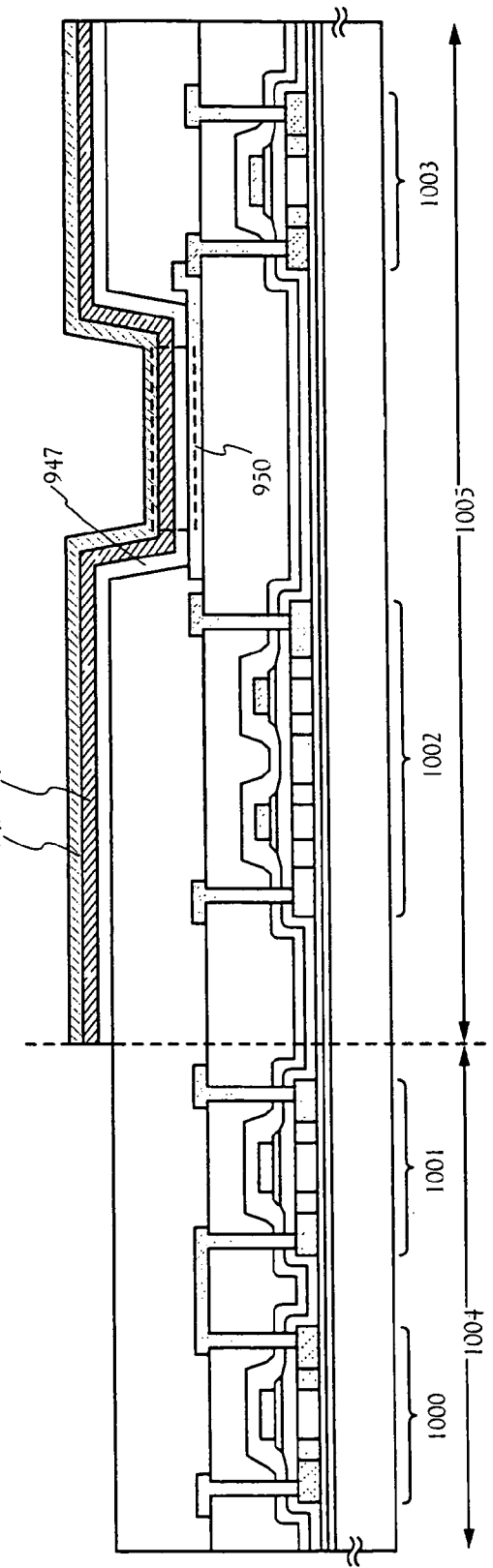

The light emitting device having the structure shown in FIG. 6B is thus complete. Note that a portion 950 in which the anode 943, the organic compound layer 948, and the cathode 949 are laminated is referred to as the light emitting element.

A p-channel TFT 1000 and an n-channel TFT 1001 are TFTs in the driver circuit 1004, and they form a CMOS circuit. A switching TFT 1002 and an electric current control TFT 1003 are TFTs in the pixel portion 1005, and TFTs in the driver circuit and the pixel portion can be formed on the same substrate.

Note that the voltage of an electric power source for the driver circuit is on the order or 5 to 6 V, and at most 10 V is sufficient, when the light emitting device uses the light emitting elements, and therefore deterioration due to hot electrons in the TFTs rarely becomes a problem.

Embodiment 2

A method of manufacturing a light emitting device is explained in Embodiment 2 using FIGS. 18 to 21B by taking an example different from that in Embodiment 1.

Manufacturing is performed in accordance with Embodiment 1 up through the step of forming the two layer conductive films 907 and 908 on the gate insulating film 906, as shown in FIG. 3A.

The conductive films 907 and 908 are then etched using the masks 909a to 909d, forming conductive layers 3901 to 3904 (3901a-3904a and 3901b-3904b) having a first tapered shape. An ICP (inductively coupled plasma) etching method is used for the etching. There are no limitations placed on the etching gasses used, but $CF_4$, $Cl_2$, and $O_2$ are used for etching of the W film and tantalum nitride film. The gas flow rates are set so as to be 25:25:10, respectively, and etching is performed at a pressure of 1 Pa with an RF (13.56 MHz) electric power of 500 W introduced into a coil shape electrode. An RF (13.56 MHz) electric power of 150 W is also applied to the substrate side (test piece stage) in this case, effectively applying a negative self bias voltage. The W film, mainly, is etched into a predetermined shape by using this first set of etching conditions.

The etching gasses are changed to $CF_4$ and $Cl_2$ next, the gas flow rate ratio is set to 30:30, an RF (13.56 MHz) electric power of 500 W is introduced into the coil shape electrode, generating a plasma, and etching is performed for on the order of 30 seconds. An RF (13.56 MHz) electric power of 20 W is also applied to the substrate side (test piece stage), effectively applying a negative self bias voltage. The mixed gas of $CF_4$ and $Cl_2$ etches the tantalum nitride film and the W film at similar speeds. The conductive layers 3901 to 3904 are thus formed having the first tapered shape. The taper is formed from 45 to 75°. Note that the etching time may also be increased by on the order of 10 to 20% in order to perform etching without any residue remaining on the second insulating film. Note also that the surface of regions not covered by the first tapered shape conductive layers 3901 to 3904 of the gate insulating film 906 is etched by 20 to 50 nm, forming regions which have become thinner (see FIG. 19A).

A second etching process is performed next as shown in FIG. 19B without removing the masks 909a to 909d. $CF_4$, $Cl_2$, and $O_2$ are used as etching, gasses, and the gas flow rates are set so as to be 20:20:20, respectively. Etching is performed at a pressure of 1 Pa with an RF (13.56 MHz) electric power of 500 W introduced into a coil shape electrode. An RF (13.56 MHz) electric power of 20 W is also applied to the substrate side (test piece stage), effectively applying a lower self bias voltage compared to that of the first etching process. The W film is etched as a second conductive film by using this second set of etching conditions. Conductive layers 3905 to 3908 (3905a-3908a and 3905b-3908b) having a second tapered shape are thus formed. The surface of regions not covered by the second tapered shape conductive layers 3905 to 3908 of the gate insulating film 906 is etched by on the order of 20 to 50 nm, becoming thinner.

A first doping process for adding an impurity element which imparts n-type conductivity (an n-type impurity element) into semiconductor layers is performed after removing the resist mask. The first doping process is performed by ion doping in which ions are injected without separation of mass. Doping is performed using the second tapered shape electrodes 3905 to 3908 as masks, and n-type impurity regions 3909 to 3912 containing a first concentration of the n-type impurity element are formed in the semiconductor films 902 to 905 using phosphine ($PH_3$) gas diluted by hydrogen, or phosphine gas diluted by a noble gas. The phosphorous concentration of the n-type impurity regions 3909 to 3912 containing the first concentration of the n-type impurity element thus formed by doping is set so as to become from $1\times10^{16}$ to $1\times10^{17}/cm^3$ (see FIG. 19C)

Thereafter, first masks 3913 and 3915 are then formed covering the entire semiconductor layers 902 and 905, and a second mask 3914 covering the second tapered shape conductive layer 3907 on the semiconductor layer 904, and a portion of the semiconductor layer 904, is formed. A second doping process is then performed. An n-type impurity region 3917 containing a second concentration of the n-type impurity element, and n-type impurity regions 3916 and 3918 containing a third concentration of the n-type impurity element, are formed in the semiconductor layer 903, through a second tapered shape conductive layer 3906a by the second doping process. The phosphorous concentration of the n-type impurity region 3917 containing the second concentration of the n-type impurity element thus formed by doping is set so as to become from $1\times10^{17}$ to $1\times10^{19}/cm^3$. The phosphorous concentration of the n-type impurint regions 3916 and 3918 containing the third concentration of the n-type impurity element is set so as to become from $1\times10^{20}$ to $1\times10^{21}/cm^3$ (see FIG. 19D).

Note that although the n-type impurity region containing the second concentration of the n-type impurity element, and the n-type impurity region containing the third concentration of the n-type impurity element are formed as discussed above by one doping process in Embodiment 2, the impurity element may also be doped by performing two doping processes.

Figure 20A:
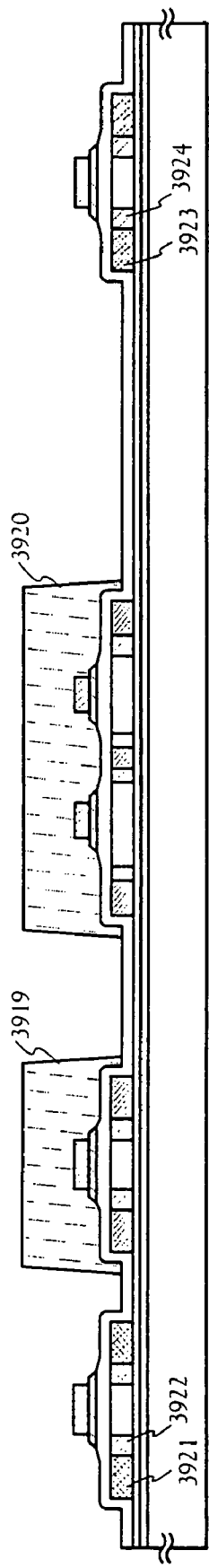
FIGS. 20A to 20C are diagrams showing the example of a method of manufacturing a light emitting device of Embodiment 2.

Masks 3919 and 3920 are formed next as shown in FIG. 20A, covering the semiconductor layers 903 and 904, and a third doping process is performed. Doping is performed using diborane ($B_2H_6$) gas diluted by hydrogen, or using diborane gas diluted by a noble ga. P-type impurity regions 3921 and 3923 containing a first concentration of a p-type impurity element, and p-type impurity regions 3922 and 3924 containing a second concentration of the p-type impurity element, are formed in the semiconductor layers 902 and 905. The p-type impurity regions 3921 and 3923 containing the first concentration of the p-type impurity element contain boron in a concentration range from $2\times10^{20}$ to $3\times10^{21}$/cm$^3$, and the p-type impurity regions 3922 and 3924 containing the second concentration of the p-type impurity element are formed in regions overlapping with second tapered shape conductive layers 3905a and 3908a, and contain boron in a concentration range from $1\times10^{18}$ to $1\times10^{20}$/cm$^3$.

Figure 20B:
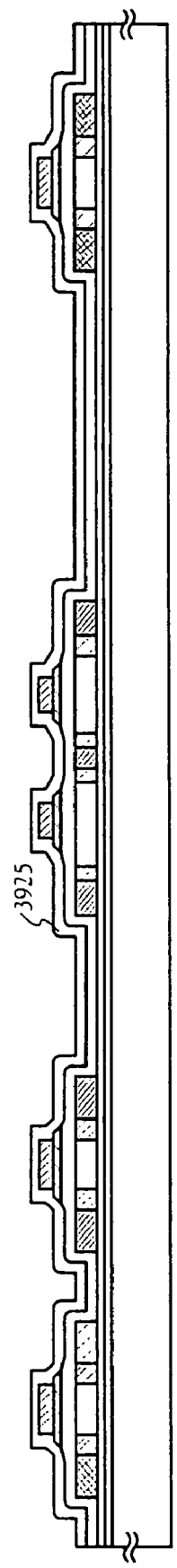

Next, a first interlayer insulating film 3925 is formed of a silicon nitride film or a silicon oxynitride film having a thickness of 50 nm by plasma CVD, as shown in FIG. 20B. Heat treatment process is then performed at 410° C. using a furnace in order to perform activation of the impurity elements added to the respective semiconductor films. Hydrogenation of the semiconductor films is performed by hydrogen released by the silicon nitride film or the silicon oxynitride film due to the heat treatment process.

Note that, in addition to the method of using a furnace, a heat treatment processing method by RTA (including RTA method using gas or light as a heat source) may also be used for heat treatment. An insulating film may be formed so as to cover the gate electrodes and the gate insulating films, before heat treatment, in order to prevent oxidation of the conductive film forming the gate electrodes in the case where heat treatment using a furnace is performed. The atmosphere during heat treatment may also be made into a reduced pressure nitrogen atmosphere. Further, the semiconductor films may also be irradiated with light from the second harmonic of a YAG laser (532 nm). There are several method of activating the impurity elements added to the semiconductor layers, and the method may be suitably determined by the operator.

Figure 20C:
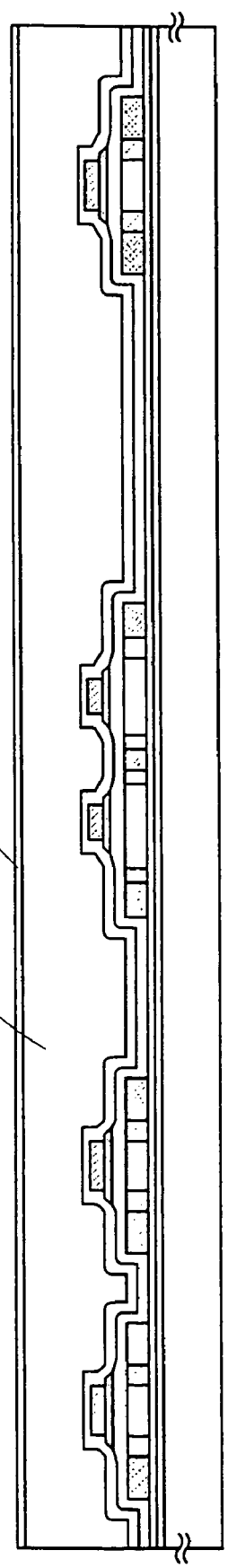

A second interlayer insulating film 3926 is next formed from an inorganic insulating material on the first interlayer insulating film 3925. A silicon oxide film or a silicon oxynitride film may be formed as the inorganic insulating material by a known method such as sputtering or plasma CVD. The second interlayer insulating film 3926 is then polished by CMP and leveled. Note that polishing by CMP is performed such that the average film thickness after leveling is set to become from 1.0 to 2.0 µm. A DLC film or a silicon nitride film as a first insulating film 3927 may then be formed on the leveled second interlayer insulating film 3926. It is thought that forming the first insulating film 3927 can prevent the deterioration of the TFT elements due to the penetration of alkaline metals, which are used during formation of the light emitting element, into the TFT side through the interlayer insulating film (FIG. 20C).

Figure 21A:
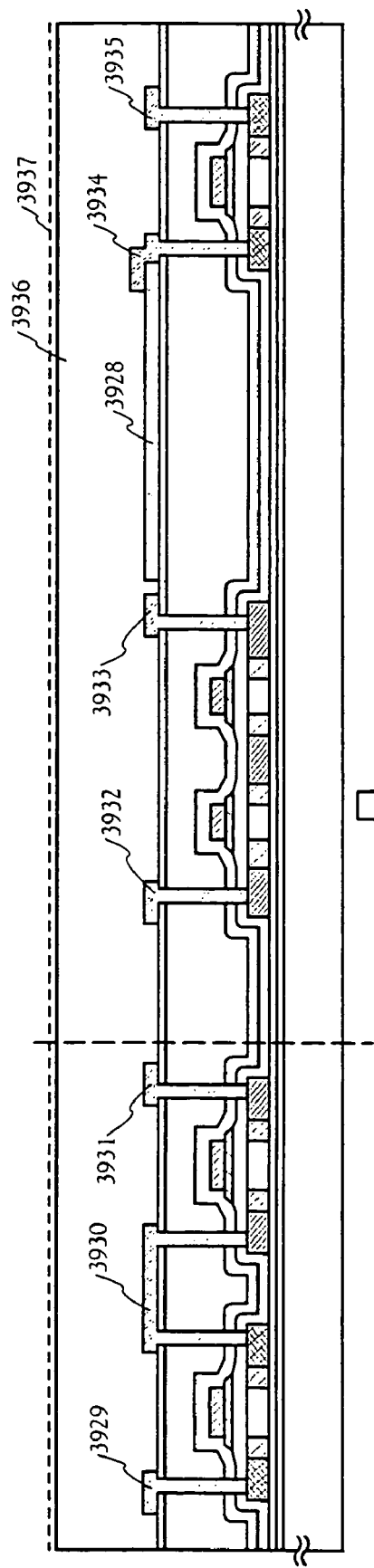
FIGS. 21A and 21B are diagrams showing the example of a method of manufacturing a light emitting device of Embodiment 2.

A transparent conductive film is formed next having a thickness of 80 to 120 nm on the barrier insulating film 3927, and an anode 3928 is formed by etching (see FIG. 21A.) Note that an indium tin oxide (ITO) film or a transparent conductive film, in which indium oxide is mixed with 2 to 20% of zinc oxide (ZnO), is used as a transparent electrode in Embodiment 2.

A resist mask having a predetermined pattern is then formed, and contact holes for reaching the impurity regions 3916, 3918, 3921, and 3923, which are become source regions or drain regions formed on the respective semiconductor layers, are formed. The contact holes may be formed by dry etching.

Wirings 3929 to 3935 are then formed by forming a conductive metallic film by sputtering or vacuum evaporation, performing patterning using, a mask, and by then etching the conductive metallic film. Although not shown in the figures, the wirings are formed by a lamination film of a Ti film having a film thickness of 50 nm, and an alloy film (an Al and Ti alloy film) having a film thickness of 500 nm in Embodiment 2.

A third interlayer insulating film 3936 is formed next, covering, the anode 3928 and the wirings 3929 to 3935. Provided that it is a substance having insulating properties, organic and inorganic materials such as a resist film, polyimide, polyamide, acrylic, BCB (benzocyclobutene), a silicon oxide film, and the like can be used as the third interlayer insulating film 3936. In order to reduce the danger of alkaline metals such as Al and Mg, which are used in a cathode material of the light emitting elements, from mixing into the active layers of the TFTs, a case of advancing, the manufacturing process by moving the substrate from a processing chamber for forming the TFT substrate (hereafter referred to as a first clean room) to a processing chamber for forming the light emitting elements (hereafter referred to as a second clean room) is assumed.

An extremely thin film 3937 having an electric charge prevention effect (hereafter referred to as an electric charge preventing film) is formed on the third interlayer insulating film 3936 so that the TFT substrate is not contaminated by, debris within the atmosphere or damaged by static electricity. Note that the electric charge preventing film 3937 may be formed from a material capable of being easily removed by washing with water (see FIG. 21A). Further, the substrate may be stored in a case capable of preventing damage due to electrification and then moved. Note that an operation test may also be performed on the TFT substrate as formed by processes up through this point before moving between processing chambers. The above steps are processes performed in the first processing chamber (clean room) shown in a flow chart in FIG. 18.

Movement from the first processing chamber to the second processing chamber may be, for example, movement within structures formed inside the same site, movement between factories (processing chambers, for example clean rooms) owned by the same company, or movement between factories (processing chambers, for example clean rooms) owned by different companies. In any case, the TFT substrate is moved such that damage and the like does not occur.

Figure 18:
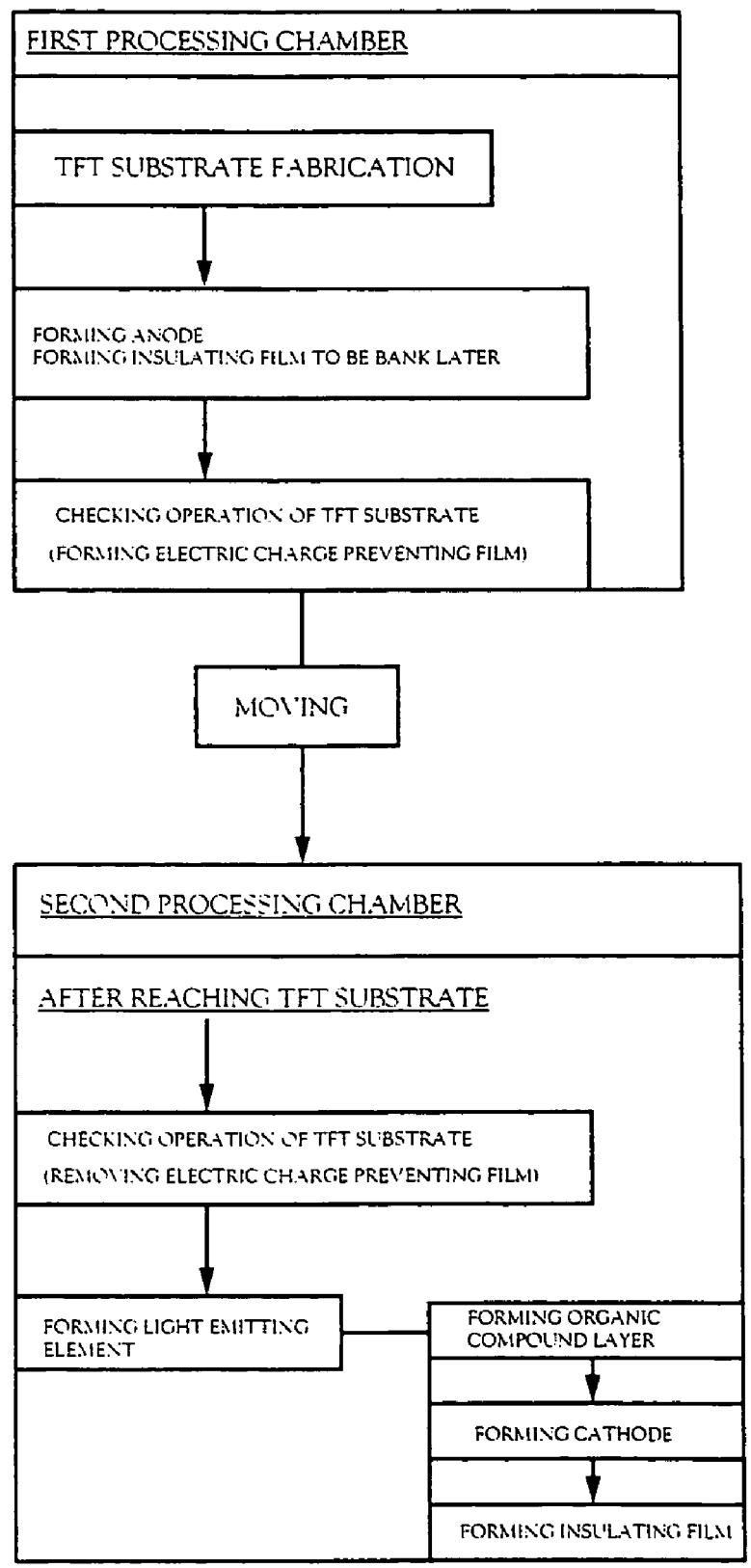
FIG. 18 is a diagram showing an image of a manufacturing process of Embodiment 2.

Processes of the second processing chamber (clean room) shown in the flow chart of FIG. 18 are then performed. The electric charge preventing film 3937 is removed by washing with water after the TFT substrate is carried into the second processing chamber (clean room), and the third interlayer insulating film 3936 is etched. A bank 3938 having an opening portion in a position corresponding to a pixel (light emitting element) and covering portions at which the wiring 3934 and the anode 3928 contact and edge portion of the anode 3928 in a tapered shape, is formed. The bank 3938 is formed using resist with a thickness on the order of 1 µm in Embodiment 2. A test for confirming the operation of the TFT substrate moved to the second processing chamber may again be performed at this point.

The surface of the bank 3938 is then covered by a second insulating film 3939, for example a silicon nitride film or the like, in order to suppress deterioration of the light emitting elements caused by the generation of moisture or gas from the bank 3938. The second insulating film 3939 is an insulating film for protection form moisture and gas, primary factors in deterioration of the tight emitting elements, and therefore is also referred to as the second barrier insulating film 3939.

An organic compound layer 3940 is then formed on the second insulating film 939 so as to contact the anode 3928, and a cathode 3941 is formed on the organic compound layer 3940, by evaporation. Note that although an MgAg electrode is used as the cathode of the light emitting element in Embodiment 2, other known materials may also be used. In addition, the organic compound layer 3940 may he formed in Embodiment 2 in accordance with Embodiment 1, and a plurality of layers, in addition to a light emitting layer, a hole injecting layer, a hole transporting layer, an electron transporting layer, an electron injecting layer, and a buffer layer may be combined and laminated.

Figure 21B:
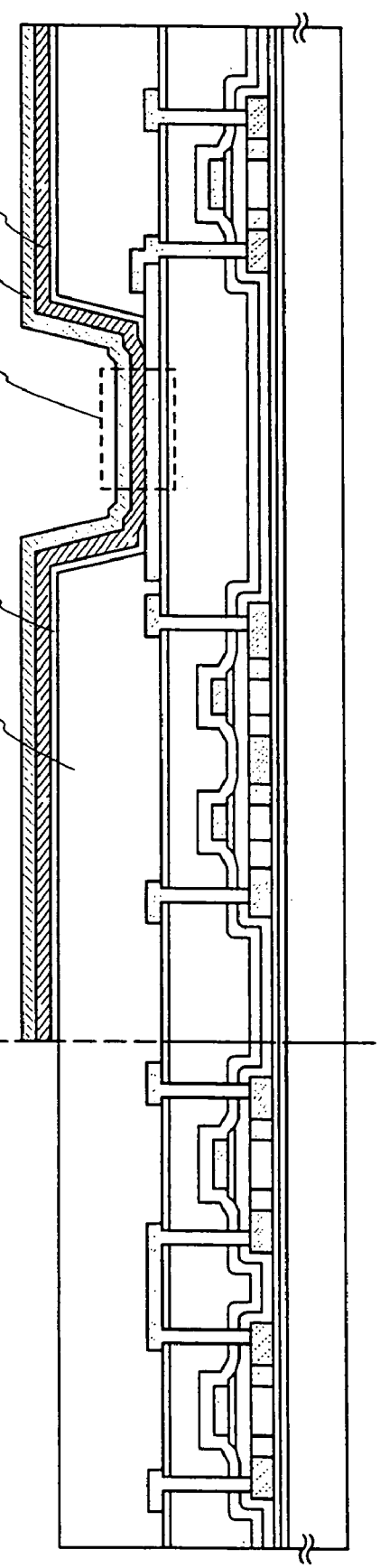

The light emitting device having a structure as shown in FIG. 21B is thus complete. Note that a portion 3942 in which the anode 3928, the organic compound layer 3940, and the cathode 3941 are laminated is referred to as the light emitting element.

The active layers of the TFTs can be protected from alkaline metal materials such as Al and Mg, which are used in the cathode material of the light emitting element, by using the first processing chamber for forming the TFT substrate (for example, the first clean room) and the second processing chamber for forming the light emitting elements (for example, the second clean room). It thus becomes possible to provide a satisfactory light emitting device.

Embodiment 3

An example of performing surface modification of the bank 946 by plasma processing of the surface of the bank 946 after forming the bank 946 in accordance with the processes of Embodiment 1 is explained with reference to FIG. 7.

The bank 946 is formed using an organic resin insulating film, but there is a problem in that moisture and gas develop, and in practice, moisture and gas more easily develop due to heat generated when actually using the light emitting device.

Figure 7:
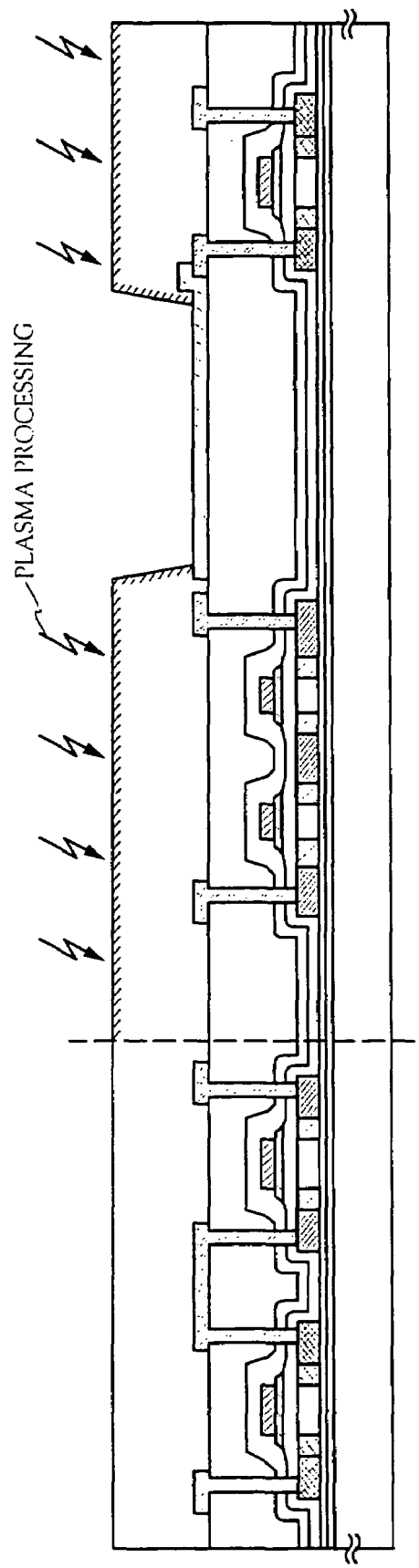
FIG. 7 is a diagram showing an example of a process of manufacturing a light emitting device of Embodiment 3.

Plasma processing is performed after heat treatment in order to perform surface modification of the bank 946 as shown in FIG. 7. Plasma processing is performed within a single type, or a plurality of types, of gas chosen from the group consisting of hydrogen, nitrogen, halocarbon, hydrogen fluoride, and noble gas.

The surface of the bank 946 is thus made finer, and a hardened film of the single type, or the plurality of types, of gas chosen from the group consisting of hydrogen, nitrogen, halocarbon, hydrogen fluoride, and noble gas is formed. The development of moisture or gas (oxygen) from an inside portion can be prevented, and deterioration of the light emitting elements can be prevented.

Embodiment 3 can be used in combination with the embodiment mode and Embodiments 1 and 2.

Embodiment 4

A structure of a CMP apparatus used during CMP polishing is explained in Embodiment 4.

Figure 11A:
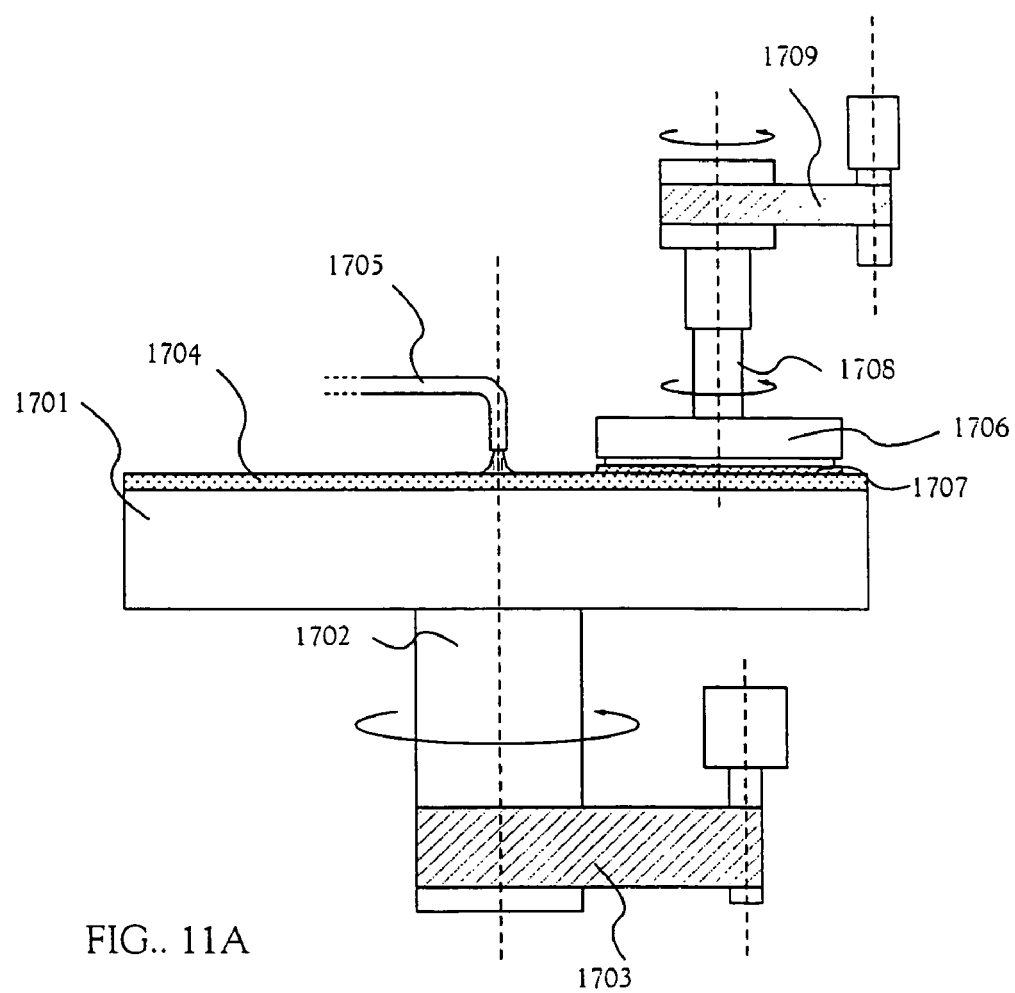
FIGS. 11A and 11B are diagrams showing an example of a CMP apparatus of Embodiment 4.
Figure 11B:
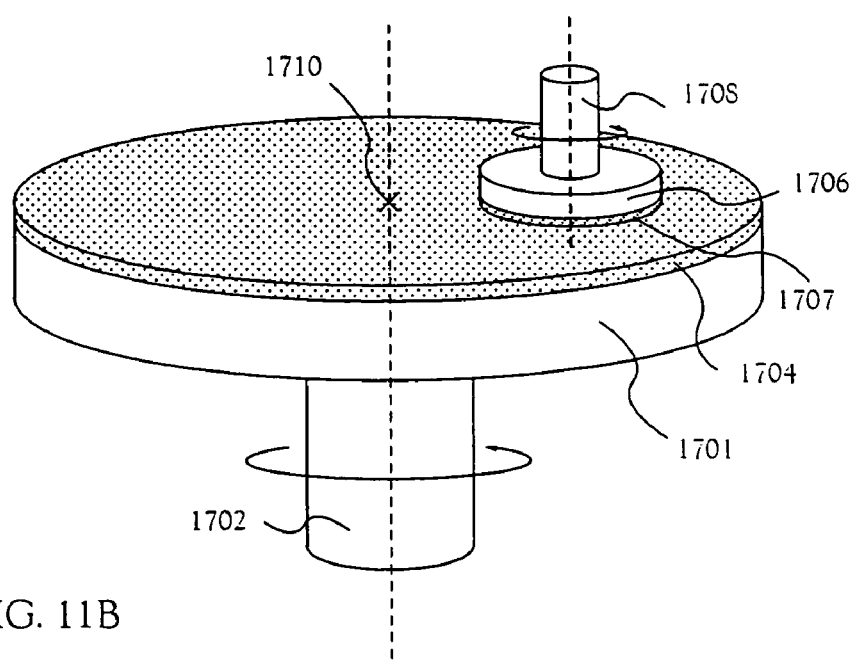

A side face diagram of a CMP apparatus of Embodiment 4 is shown in FIG. 11A, and a perspective view thereof is shown in FIG. 11B. Reference numeral 1701 denotes a platen, and the platen rotates in a direction shown by an arrow, or in the opposite direction, by a driving shaft (a) 1702. The driving shaft (a) 1702 is fixed into position by an arm (a) 1703.

A pad 1704 is formed on the platen 1701. Known polishing cloths and polishing pads can be used as the pad 1704. A slurry supply nozzle 1705 for supplying a slurry to the pad 1704 is prepared, and a slurry is supplied from the slurry supply nozzle 1705 to a slurry supply position 1710 near the center of the pad 1704 in Embodiment 4. It is possible to use known materials for the slurry.

Reference numeral 1706 denotes a carrier, and the carrier 1706 has functions for fixing an active matrix substrate 1707 and rotating it on the pad 1704. The carrier 1706 rotates in the direction shown by an arrow, or in the opposite direction, by a driving shaft (b) 1708. The driving shaft (b) 1708 is fixed in place by an arm (b) 1709.

Note that the active matrix substrate 1707 is maintained such that a surface, on which an insulating film that becomes a leveled film is formed, faces the pad 1704.

Note also that, although not formed in Embodiment 4, shape changes of the polishing cloth in edge portions of the active matrix substrate can be suppressed b)y using a pad pressure ring if the polishing cloth is used for the pad 1704. The surface profile of the polishing cloth changes and a uniform polishing cloth shape can be obtained when applying a pressure to the pad pressure ring which is 1.2 to 1.6 times the polishing pressure of the active matrix substrate 1707.

Figure 12:
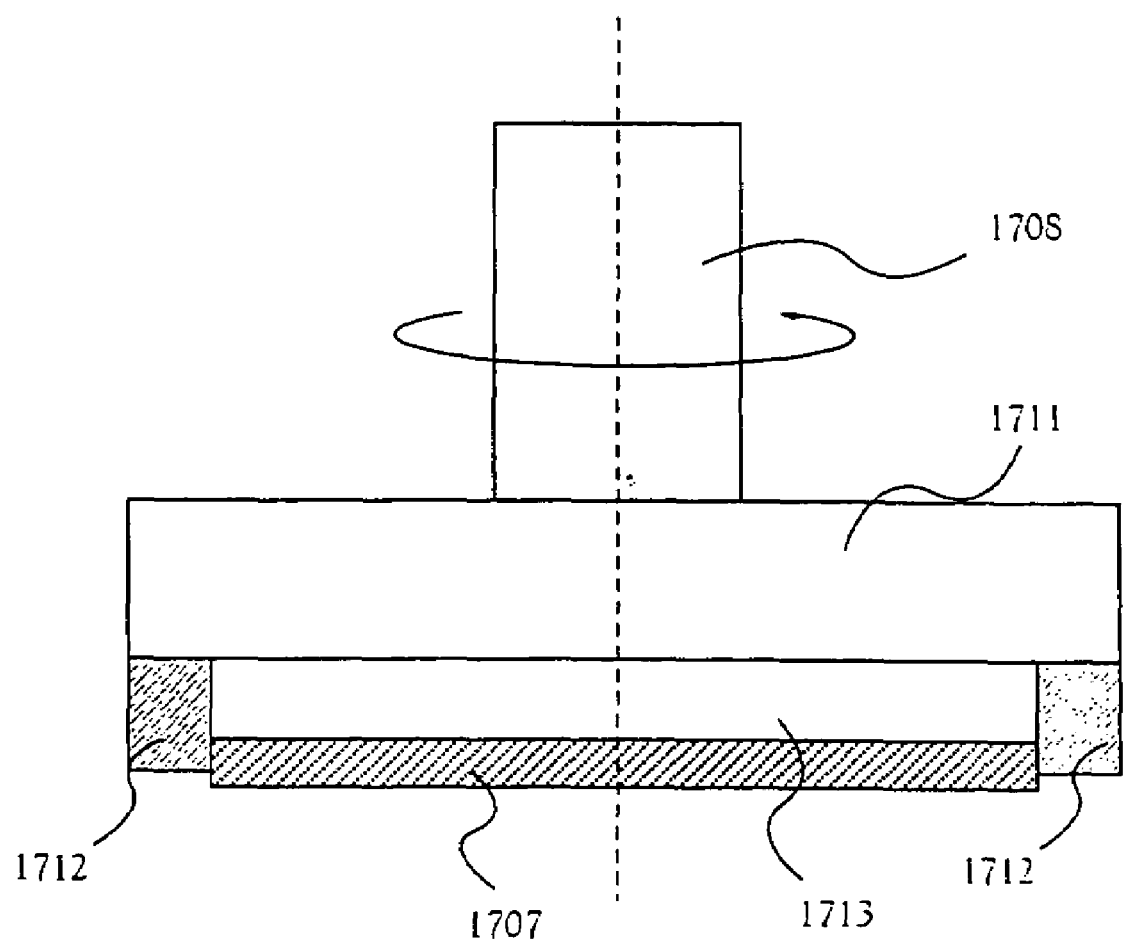
FIG. 12 is a blowup diagram of a carrier of Embodiment 4.

FIG. 12 is a detailed diagram of the carrier 1706 shown in FIGS. 11A and 11B. The carrier 1706 has a polishing housing 1711, a wafer chuck 1713, and a retaining ring 1712. The wafer chuck 1713 maintains the active matrix substrate 1707, and the retaining ring 1712 prevents the active matrix substrate 1707 from slipping during polishing. The polishing housing 1711 maintains the wafer chuck 1713 and the retaining ring 1712, and has a function of applying the polishing pressure.

A pressure adding function and a rotating function are required for the carrier 1707, and therefore a method in which the carrier possesses a rotational axis in its center, and a load is applied along the axis is generally used. When a load is added along the center axis, the load distribution in the surface of the active matrix substrate is highest under the center axis, and the load cannot be prevented from dropping in the periphery of the center axis. Therefore a known load compensating function may also be built into the polishing housing, allowing for uniform polishing within the surface of the active matrix substrate.

The CMP method shown in Embodiment 4 can be used in combination with the embodiment mode and Embodiments 1 to 3.

Embodiment 5

Figure 16A:
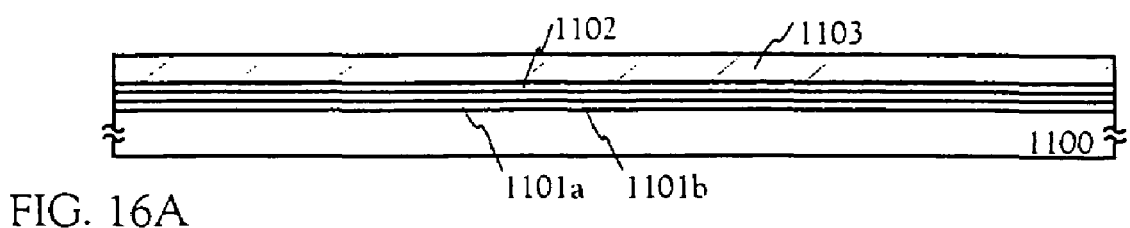
FIGS. 16A to 16F are diagrams showing an example of a method of manufacturing a light emitting device of Embodiment 5.

Preferably, a material such as barium borosilicate glass, alumino-borosilicate glass, or quartz can be used as a substrate 1100 in FIG. 16A. An inorganic insulating film is formed on the surface of the substrate 1100 to have a thickness of 10 to 200 nm as a base insulating film 1101. One example of a preferable base insulating film is a silicon oxynitride film manufactured by plasma CVD. A first silicon oxynitride film 1101a manufactured from $SiH_4$, $NH_3$, and $N_2O$ with a thickness of 50 nm, and a second silicon oxynitride film 1101b manufactured from $SiH_4$ and $N_2O$ with a thickness of 100 nm is applied. The base insulating film 1101 is formed so that alkaline metals contained in the glass substrate do not diffuse within semiconductor films formed on the substrate, and it is possible to omit the base insulating film if quartz is used as the substrate.

Next, a silicon nitride film 1102 is formed on the base insulating film 1101. The silicon nitride film 1102 is a film formed in order to prevent contamination of the base insulating film 1101 due to catalytic elements (typically nickel) used during a later process of crystallizing the semiconductor films, and in addition, in order to prevent oxygen contained in the base insulating film 1101 from causing any adverse influence. Note that the silicon nitride film 1102 may be formed by plasma CVD at a film thickness of 1 to 5 nm.

An amorphous semiconductor film 1103 is then formed on the silicon nitride film 1102. A semiconductor material having silicon as its main component is used as the amorphous semiconductor film 1103. A film such as an amorphous silicon film or an amorphous silicon germanium film is typically applied, and formed to have a thickness of 10 to 100 nm by plasma CVD, reduced pressure CVD, or sputtering. The concentration of impurities such as oxygen and nitrogen contained in the amorphous semiconductor film 1103 may be reduced to be equal to, or less than, $5 \times 10^{18}/cm^3$ in order to obtain satisfactory crystals. These impurities become primary factors in hindering crystallization of the amorphous semiconductor, and further, cause the density of capture centers and recombination centers to increase. It is therefore preferable to use high purity material gasses from the beginning, and to use a CVD apparatus capable of an extremely high vacuum, in which the inside of the reaction chamber has undergone mirror surface processing (electric field polishing processing), and which is prepared with an oil free vacuum evacuation system. Note that film formation can be performed in succession from the base insulating film 1101 to the amorphous semiconductor film 1103, without exposure to the atmosphere.

Figure 16B:
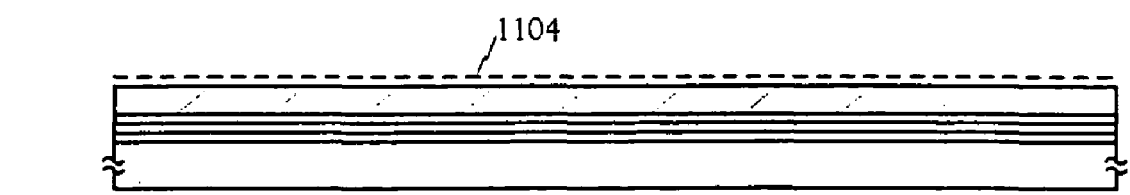

A metallic element that has a catalytic action for promoting crystallization is then added to the surface of the amorphous silicon film 1103 (see FIG. 16B). One element, or a plurality of elements, selected from the group consisting of iron (Fe), nickel (Ni), cobalt (Co), ruthenium (Ru), rhodium (Rh) palladium (Pd), osmium (Os), iridium (Ir), platinum (Pt), copper (Cu) and gold (Au) can be used as the metallic element that has a catalytic action for promoting crystallization of the semiconductor film. Nickel is typically used, and a catalyst containing layer 1104 is formed by applying a nickel acetate salt solution, containing nickel of 1 to 100 ppm by weight, using a spinner. An extremely thin oxidized film may be fonred by an ozone containing aqueous solution as a surface treating of the amorphous silicon film 1103 in order to increase the compatibility of the liquid. A clean surface is formed after etching the oxide film using a mixed solution of hydrofluoric acid and hydrogen peroxide, and an extremely thin oxide film is formed once again by processing with an ozone containing aqueous solution. The surface of semiconductor films such as silicon is initially hydrophobic, and therefore a uniform application of the nickel acetate salt solution can be achieved by thus forming the oxide film.

The catalyst containing layer 1104 is of course not limited to this type of method, and may also be formed using sputtering, evaporation, plasma processing, or the like.

Heat treatment is performed for crystallization while maintaining the state in which the amorphous silicon film 1103 and the catalytic element containing layer 1104 are in contact. A furnace annealing method using an electric furnace, or a rapid thermal annealing (hereafter referred to as RTA) method using a heat source such as a halogen lamp, a metal halide lamp, a xenon arc lamp, a carbon arc lamp, a high pressure sodium lamp, or a high pressure mercury lamp is employed as the heat treatment method.

Figure 16C:
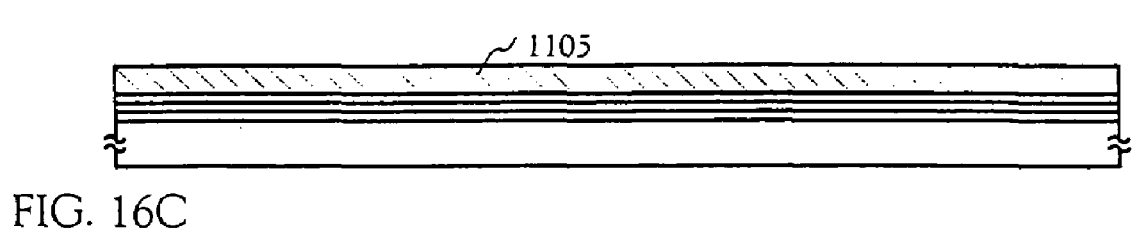

A heat treatment lamp light source is turned on for 1 to 60 seconds, preferably for 30 to 60 seconds, and this is repeated 1 and 10 times, preferably 2 to 6 times, when performing the RTA method. The intensity of light emitted from the lamp light source may be arbitrarily set, but it is preferable to set the intensity such that the semiconductor film is instantaneously heated to a temperature of 600 to 1000° C., preferably up to about 650 to 750° C. Even with this high temperature, the semiconductor film is only heated instantaneously, and therefore the substrate 1100 itself is not distorted to change the shape. The amorphous semiconductor film can thus be crystallized, and a crystalline silicon film 1105 can thus be obtained as shown in FIG. 16C. Crystallization by this type of process was first achieved by forming the catalytic element containing layer.

Heating treatment is performed at 500° C. for on the order of 1 hour as a preprocess to release hydrogen contained in the amorphous silicon film 1103 before heat treatment, in the case where furnace annealing is used as another method of heat treatment. Heat treatment is then performed within a nitrogen atmosphere using an electric furnace at a temperature of 550 to 600° C., preferably at 580° C. for four hours, crystallizing the amorphous silicon film 1103. The crystalline silicon film 1105 shown in FIG. 16C is thus formed.

In addition, irradiation of laser light to the crystalline silicon film 1105 is effective for increasing the crystallinity (the proportion of crystal components in the entire volume of the film) and for repairing faults remaining within crystal grains.

The catalytic element (nickel here) of an average concentration that exceeds $1 \times 10^{19}/cm^3$ remains in the crystalline silicon film 1105 thus obtained. If the catalytic element remains in the crystalline film, there is a possibility that it will exert an adverse influence on the TFT properties, and therefore it is necessary to reduce the concentration of the catalytic element in the semiconductor layer. A method of reducing the concentration of the catalytic element in the semiconductor layer after crystallization process is explained here.

Figure 16D:
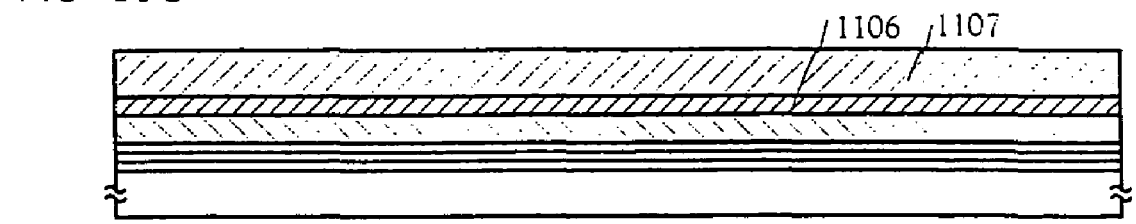

First, a thin layer 1106 is formed in the surface of the crystalline silicon film 1105 as shown in FIG. 16D. The thin layer 1106 formed on the crystalline silicon film 1105 is a layer formed so that the crystalline silicon film 1105 will not be etched when removing gettering sites later, and is referred to as the barrier layer 1106 in this specification.

The thickness of the barrier layer 1106 is set to be 1 to 10 nm, and a chemical oxide formed simply by processing with aqueous ozone may be used as the barrier layer. Further, a chemical oxide can also be similarly formed by processing with an aqueous solution in which a material such as sulfuric acid, hydrochloric acid or nitric acid is mixed with aqueous hydrogen peroxide. In addition, plasma processing within an oxidizing atmosphere, and oxidation processing in which ozone is generated by ultraviolet light irradiation in an atmosphere containing oxygen may also be performed as other methods. Further, a thin oxide film may also be formed as the barrier layer by heating to a temperature of 200 to 350° C. using a clean oven. Alternatively, a 1 to 5 nm thick oxide film may be deposited by a method such as plasma CVD, sputtering, or evaporation, and used as the barrier layer. Whichever method is employed, a film is used so that the catalytic elements can move to the gettering sites during gettering processing, and through which an etching liquid used during removal of the gettering sites does not permeate (which protects the crystalline silicon film 1105 from the etching liquid). For example, a chemical oxide film formed by processing with aqueous ozone, a silicon oxide film (SiOx), and a porous film may be used.

A second semiconductor film containing an inert gas element within the film at a concentration equal to or greater than $1 \times 10^{20}/cm^3$ (typically an amorphous silicon film) is then formed by sputtering to have a thickness of 25 to 250 nm on the barrier layer 1106. The second semiconductor film is formed as gettering sites 1107. In order to increase the etching selectivity of the gettering sites 1107, which are later removed, with respect to the crystalline silicon film 1105, it is preferable to form a low density film.

Note that the inert gas itself is inert within the semiconductor film, and therefore it does not exert any adverse influence on the crystalline semiconductor film 1105. Further, one element, or a plurality of elements, selected from the group consisting of helium (He), neon (Ne), argon (Ar), krypton (Kr), and xenon (Xe) is used as the inert gas element. The present invention is characterized in that the inert gas elements are used as ion sources in order to form gettering sites, and further, a semiconductor film containing these elements is formed, and the film is used as gettering sites.

It becomes necessary to perform heat treatment afterward in order to achieve gettering with certainty. Furnace annealing or RTA is performed for the heat treatment. When furnace annealing is used, heat treatment is performed for 0.5 to 12 hours at a temperature of 450 to 600° C. in a nitrogen atmosphere. Further, if RTA is used, a heating lamp light source is turned on for 1 to 60 seconds, preferably for 30 to 60 seconds, and this is repeated 1 and 10 times, preferably 2 and 6 times. The intensity of light emitted from the lamp light source may be arbitrarily set, but processing, is performed such that the semiconductor film is heated instantaneously to a temperature of 600 to 1000° C., preferably up to about 700 and 750° C.

Figure 16E:
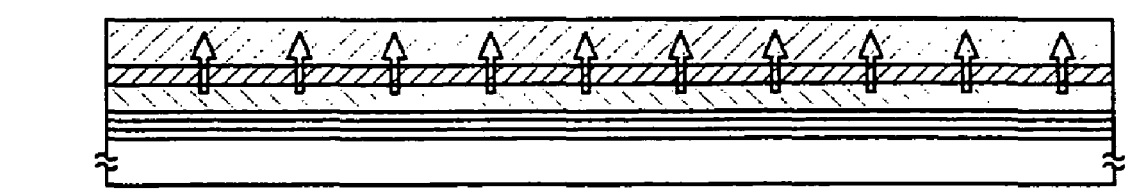

During gettering the catalytic elements in a region to be gettered (capture site) are released by thermal energy, and then move to the gettering sites by diffusion. Gettering therefore depends on the processing temperature, and the time needed for gettering to proceed becomes shorter as the processing temperature becomes higher. The distance that the catalytic elements move during gettering is a distance on the order of the film thickness of the semiconductor film in this gettering process, and therefore gettering can be accomplished in a relatively short amount of time (see FIG. 16E).

Note that the semiconductor film 1107 containing the inert gas elements at a concentration of $1 \times 10^{19}$ to $1 \times 10^{21}/cm^3$, preferably between $1 \times 10^{20}$ to $1 \times 10^{21}/cm^3$, more preferably at $5 \times 10^{20}/cm^3$ is not crystallized by this heat treatment. This is thought to be because the inert gas elements are not released and remain within the film in the aforementioned range of processing temperatures, thus inhibiting crystallization of the semiconductor film.

The gettering sites 1107 are selectively etched after the gettering process is complete, and removed. Dry etching by $ClF_3$ without using a plasma, and wet etching by an alkaline solution such as an aqueous solution containing hydrating or tetraethylammonium hydroxide (chemical formula $(CH_3)_4NOH$) can be used as etching methods. The barrier layer 1106 functions as an etching stopper at this time. Further, the barrier layer 1106 may be removed by using hydrofluoric acid.

Figure 16F:
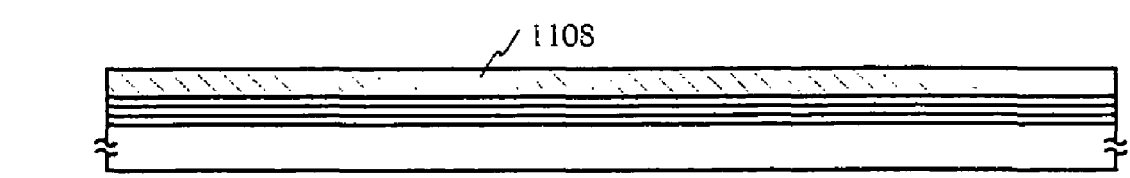

A crystalline silicon film 1108 in which the concentration of the catalytic element is reduced to be equal to or less than $1 \times 10^{17}/cm^3$ can thus he obtained, as shown in FIG. 16F. The crystalline silicon film 1108 thus formed is one in which thin rod shape or thin flattened rod shape crystals are formed due to the catalyst action, and crystal growth is such that there is a specific directionality present in each of the crystals when viewed macroscopically.

Embodiment 5 can be used in combination with the embodiment mode and Embodiments 1 to 4.

Embodiment 6

As this embodiment, the following will specifically describe a process in which the light emitting panel produced as illustrated in FIG. 6B according to the manufacturing process in Embodiments 1 to 5 is caused to be completed as a light emitting device, referring to FIGS. 8A and 8B.

FIG. 8A is a top view of the light emitting panel wherein the element substrate is airtightly sealed, and FIG. 8B is a sectional view taken on line A-A' of FIG. 8A. Reference number 801 represents a source driving side circuit, which is illustrated by dot lines; reference number 802, a pixel section; reference number 803, a gate side driver circuit; reference number 804, a sealing substrate; and reference number 805, a sealing agent. The inside surround by the seal agent 805 is a space 807.

Through wirings (not illustrated) for transmitting signals inputted to the source side driver circuit 801 and the gate side driver circuit 803, video signals or clock signals are received from a flexible print circuit (FPC) 809, which is an external input terminal. The state that the FPC is connected to the light emitting panel is shown herein. In the present specification, any module on which integrated circuits (ICs) are directly mounted is referred to as a light emitting device.

Referring to FIG. 8B, the following will describe the sectional configuration of the light emitting panel illustrated in FIG. 8A. The pixel section 802 and the gate side driver circuit 803 are formed above a substrate 810. The pixel section 802 is composed of pixels, each of which includes a current-controlling TFT 811 and an anode 812 connected electrically to its drain. The gate side driver circuit 803 is composed of a CMOS circuit wherein an n-channel type TFT 813 and a p-channel type TFT 814 are combined with each other.

Banks 815 are formed at both sides of each of the anodes 812. Thereafter, an insulating film 821, an organic compound layer 816 and a cathode 817 are formed on the anodes 812 to produce a light emitting element 818.

The cathodes 817 function as a wiring common to all of the pixels, and are electrically connected to the FPC 809 through a wiring 808.

The sealing substrate 804 made of glass is stuck to the substrate 810 with the sealing agent 805. As the sealing agent 805, an ultraviolet setting resin or thermosetting resin is preferably used. If necessary, a space composed of a resin film may be disposed in order to keep an interval between the sealing substrate 804 and the light emitting elements 818. An inert gas such as nitrogen or rare gas is filled into the space 807 surrounded by the sealing agent 805. It is desired that the sealing agent 805 is made of a material whose water- or oxygen-permeability is as small as possible.

By putting the light emitting elements airtightly into the space 807 in the above-mentioned configuration, the light emitting elements can he completely shut off from the outside. As a result, it is possible to prevent the deterioration of the light emitting elements by water content or oxygen from the outside. Accordingly, a light emitting device having high reliability can be yielded.

The configuration of this embodiment may be combined with the configuration of Embodiments 1 to 5 at will.

Embodiment 7

Figure 9A:
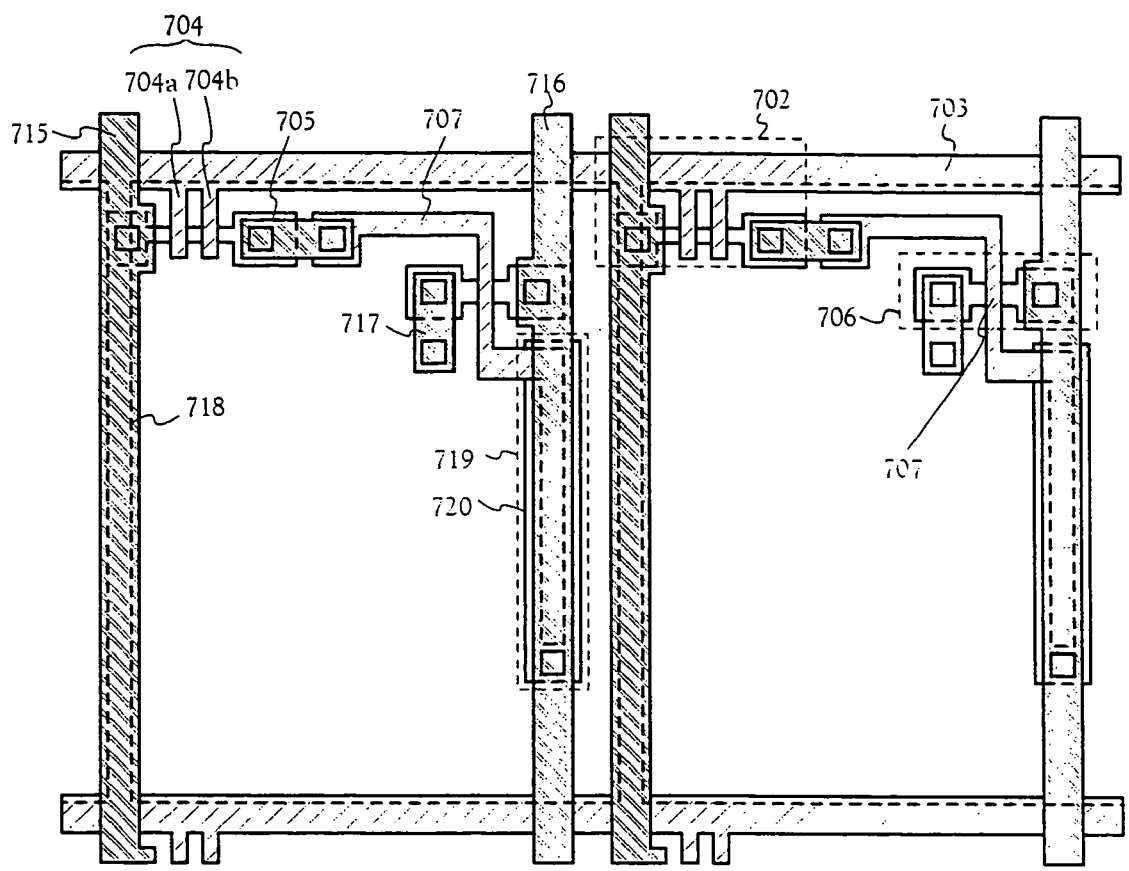
FIGS. 9A and 9B are diagrams showing a structure of a pixel portion of a light emitting device of Embodiment 7.
Figure 9B:
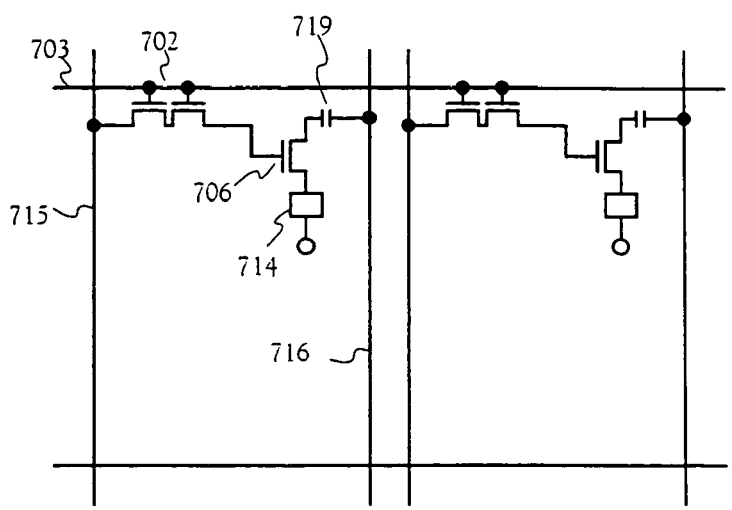

A more detailed top surface structure of a pixel portion of a light emitting device formed using the present invention is shown in FIG. 9A, and a circuit diagram is shown in FIG. 9B. In FIGS. 9A and 9B, a switching TFT 702 formed on a substrate is formed using the switching (n-channel) TFT 1002 in FIG. 6. The explanation of the switching (n-channel) TFT 1002 may therefore be referred to regarding an explanation of the switching TFT 702 structure. Further, a wiring denoted by reference numeral 703 is a gate wiring electrically connected to gate electrodes 704a and 704b of the switching TFT 702.

Note that although a double gate structure in which two channel forming regions are formed is used in Embodiment 7, a single gate structure having one channel region, and a triple gate structure in which three channel forming regions are formed may also be used.

Further, a source of the switching TFT 702 is connected to a source wiring 715, and a drain is connected to a drain wiring 705. The drain wiring 705 is electrically connected to a gate electrode 707 of an electric current control TFT 706. Note that the electric current control TFT 706 is formed using the electric current control (p-channel) TFT 1003 of FIG. 6. The explanation of the electric current control (p-channel) TFT 1003 may therefore be referred to an explanation of the electric current control TFT 706. Note that although a single gate structure is used in Embodiment 7, a double gate structure or a triple gate structure may also be used for the electric current control TFT 706.

A source of the electric current control TFT 706 is electrically connected to an electric current supply line 716, and a drain is electrically connected to a drain wiring 717. Furthermore, the drain wiring 717 is electrically connected to an anode (pixel electrode) 718 shown by a dotted line. Reference numeral 714 indicates a light emitting element.

A storage capacitor is formed at this point in a region shown by reference numeral 719. The storage capacitor 719 is formed between a semiconductor film 720 that is electrically connected to the electric current supply line 716, an insulating film (not shown) on the same layer as a gate insulating film, and the gate electrode 707. It is also possible to use a capacitance formed by the gate electrode 707, a layer that is the same as a first interlayer insulating film (not shown), and the electric current supply line 716 as a storage capacitor.

Note that it is possible to implement the constitution of Embodiment 7 in combination with the constitution of Embodiments 1 to 6.

Embodiment 8

This embodiment describes a case of employing other insulating films than a DLC film to form as the insulating film 935B on the second interlayer insulating film (935, 3926).

Following the description of Embodiment 1 or 2, the manufacture process up through the step of forming the second interlayer insulating film (935 or 3926) is finished. Then, as the insulating film, a silicon nitride film 935B is formed by sputtering using silicon as a target (FIG. 17). The film formation conditions can be set suitably, but it is particularly preferable to use nitrogen ($N_2$) or mixture of nitrogen and argon as sputtering gas and apply a high frequency power for sputtering. The substrate temperature is set to room temperature and it is not always necessary to use heating means. If an organic insulating film is used as the interlayer insulating film, it is preferred to form the silicon nitride film without heating the substrate. In order to remove the adsorbed or occluded moisture well, dehydrogenating treatment is preferably conducted by heating the substrate in vacuum at 50 to 100° C. for several minutes to several hours. To give an example of the film formation conditions, a 1 to 2 Ωsq. silicon target doped with boron is used, nitrogen gas alone is supplied, a high frequency power (13.56 MHz) of 800 W is given at 0.4 Pa, and the size of the target is set to 152.4 mm in diameter. The film formation rate obtained under these conditions is 2 to 4 nm/min.

The thus obtained silicon nitride film contains impurity elements such as oxygen and hydrogen in a concentration of 1 atomic % or less, and has 80% or higher transmissivity in the visible light range. The transparency of this film is proved to be high especially by the fact that the film has a transnmissivity of 80% or above at a wavelength of 400 nm. Furthermore, this method is capable of forming a dense film without seriously damaging the surface.

As described above, a silicon nitride film can be used for the insulating film 95B. The subsequent steps are identical with those in Embodiment 1 or 2.

Embodiment 9

This embodiment describes a case of employing other insulating films than a DLC film to form as the first insulating film 935B on the second interlayer insulating film (935, 3926).

Following the description of Embodiment 1 or 2, the manufacture process up through the step of forming the second interlayer insulating film (935 or 3926) is finished. Then, an $Al_xN_y$ film is formed using an aluminum nitride (AlN) target under an atmosphere obtained by mixing argon gas and nitrogen gas. The acceptable range for the concentration of impurities, oxygen, in particular, contained in the $Al_xN_y$ film is less than 0 to 10 atomic %. The oxygen concentration can he controlled by adjusting sputtering conditions (the substrate temperature, the type of raw material gas used, the flow rate thereof, the film formation pressure, etc.) appropriately. Alternatively, the film may be formed using an aluminum (Al) target under an atmosphere containing nitrogen gas. The film may be formed by evaporation or other known techniques instead of sputtering.

Other than the $Al_xN_y$ film, it is possible to use a $AlN_xO_y$ film that is formed using an aluminum nitride (AlN) target under an atmosphere obtained by mixing argon gas, nitrogen gas, and oxygen gas. The acceptable range for concentration of nitrogen contained in the $AlN_xO_y$ film is a few atomic % or more, preferably 2.5 to 47.5 atomic %. The nitrogen concentration can be controlled by adjusting sputtering conditions (the substrate temperature, the type of raw material gas used, the flow rate thereof, the film formation pressure, etc.) appropriately. Alternatively, the film may be formed using an aluminum (Al) target under an atmosphere containing nitrogen gas and oxygen gas. The film may be formed by evaporation or other known techniques instead of sputtering.

The above $Al_xN_y$ film and $AlN_xO_y$ film are both highly light-transmissive (having a transmissivity of 80 to 91.3% in the visible light range) and do not block light emitted from the light emitting element.

As described in the above, a $Al_xN_y$ film or $AlN_xO_y$ film can be used for the insulating film 935B. The subsequent steps are identical with those in Embodiment 1.

Embodiment 10

The light emitting device is of the self-emission type, and thus exhibits more excellent recognizability of the displayed image in a light place as compared to the liquid crystal display device. Furthermore, the light emitting device has a wider viewing angle. Accordingly, various electronic devices can be completed by using the light emitting, device to a display portion.

Such electronic devices include a video camera, a digital camera, a goggles-type display (head mount display), a navigation system, a sound reproduction device (a car audio equipment and an audio set), a laptop personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the self-emission device is preferable, since the portable information terminal that is likely to be viewed from a tilted direction is often required to have a wide viewing angle. FIGS. 10A to 10H respectively show various specific examples of such electronic devices.

Figure 10A:
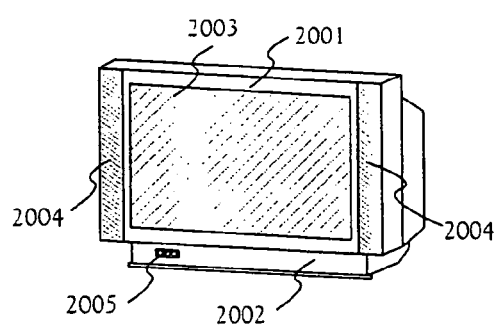
FIGS. 10A to 10H are diagrams showing examples of electronic devices of Embodiment 10.

FIG. 10A illustrates a display device which includes a frame 2001, a support table 2002, a display portion 2003, a speaker portion 2004, a video input terminal 2005 or the like. The light emitting device manufactured by the present invention can be used as the display portion 2003. The light emitting device is of the self-emission type and therefore requires no back light. Thus, the display portion thereof can have a thickness thinner than that of the liquid crystal display device. The display device is including all of the display device for displaying information, such as a personal computer, a receiver of TV broadcasting and an advertising display.

Figure 10B:
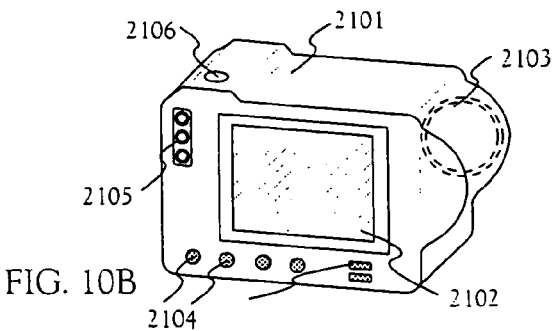

FIG. 10B illustrated a digital still camera which includes a main body 2101, a display portion 2102, an image receiving portion 2103, an operation key 2104, an external connection port 2105, a shutter 2106, or the like. The light emitting device manufactured by the present invention can be used as the display portion 2102.

Figure 10C:
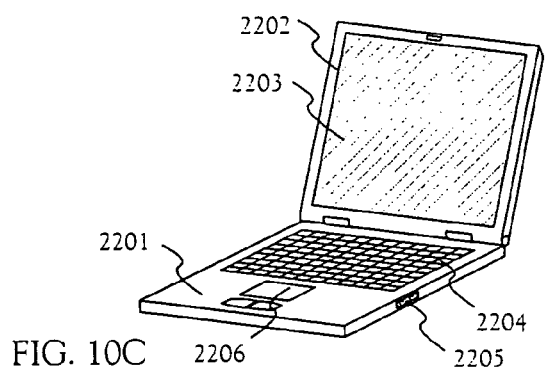

FIG. 10C illustrates a laptop (notebook) type personal computer which includes a main body 2201, a casing 2202, a display portion 2203, a keyboard 2204, an external connection port 2205, a pointing mouse 2206, or the like. The light emitting device manufactured by the present invention can be used as the display portion 2203.

Figure 10D:
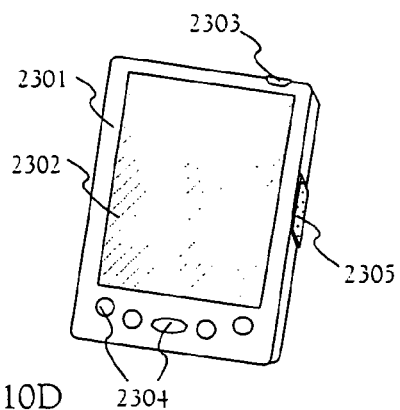

FIG. 10D illustrated a mobile computer which includes a main body 2301, a display portion 2302, a switch 2303, an operation key 2304, an infrared port 2305, or the like. The light emitting device manufactured by the present invention can be used as the display portion 2302.

Figure 10E:
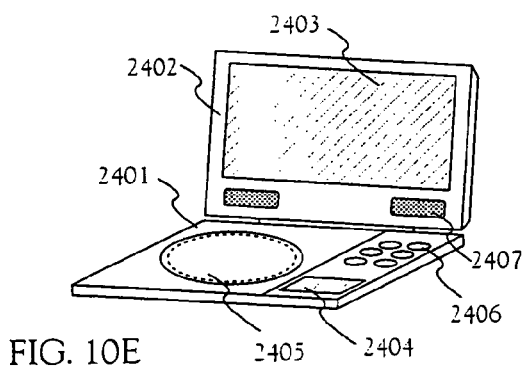

FIG. 10E illustrates an image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The light emitting device manufactured by the present invention can be used as the display portion A 2403 and B 2404. The image reproduction apparatus including a recording medium further includes a game machine or the like.

Figure 10F:
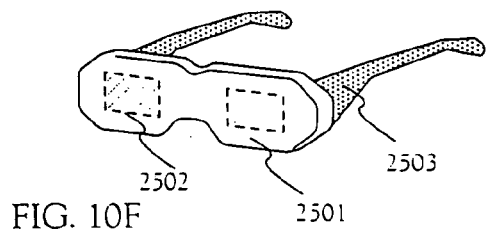

FIG. 10F illustrates a goggle type display (head mounted display) which includes a main body 2501, a display portion 2502, an arm portion 2503. The light emitting device in accordance with the present invention can be used as the display portion 2502.

Figure 10G:
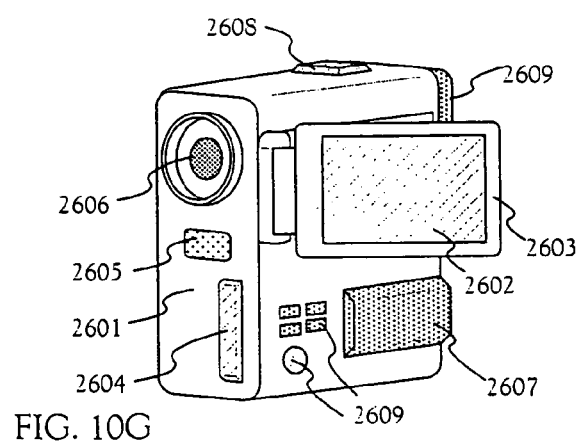

FIG. 10G illustrates a video camera which includes a main body 2601, a display portion 2602, an audio input portion 2603, an external connecting port 2604, a remote control receiving portion 2605, an image receiving portion 2606, a battery 2607, a sound input portion 2608, an operation key 2609, or the like. The light emitting device manufactured by the present invention can be used to the display portion 2602.

Figure 10H:
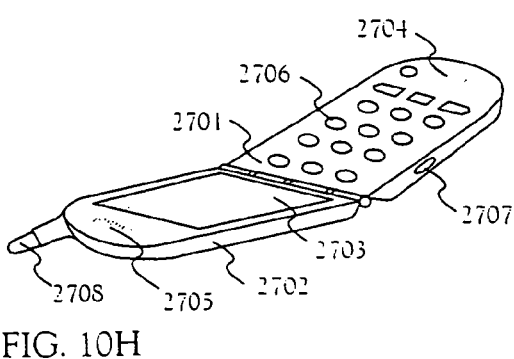

FIG. 10H illustrates a mobile phone (cellular phone) which includes a main body 2701, a casing 2702, a display portion 2703, a sound input portion 2704, a sound output portion 2705, an operation key 2706, an external connecting port 2707, an antenna 2708, or the like. The mobile phone can be completed by using the light emitting device manufactured by the present invention to the display portion 2703. Note that the display portion 2703 can reduce power consumption of the portable telephone by displaying white-colored characters on a black-colored background.

When the brighter luminance of the organic material becomes available in the future, the light emitting device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light emitting device is suitable for displaying moving pictures since the organic material can exhibit high response speed.

A portion of the light emitting device that is emitting light consumes power, so it is desirable to display information in such a manner that the light emitting portion therein becomes as small as possible. Accordingly, when the light emitting device is applied to a display portion which mainly displays character information, e.g., a display portion of a portable information terminal, and more particular, a portable telephone or a sound reproduction device, it is desirable to drive the light emitting device so that the character information is formed by a light-emitting portion while a non-emission portion corresponds to the background.

As set forth above, the light emitting device formed by using the present invention can be applied variously to a wide range of electronic devices in all fields. The electronic device in the present embodiment can be completed by using a light emitting device shown in Embodiments 1 to 9 to the display portion.

The electric current density in an organic compound layer can be increased by leveling the surface of an anode using the present invention. Further, the driver voltage can be decreased, and the light emitting element lifetime can be increased.

Furthermore, a TFT substrate can be moved without deterioration to the TFT properties, and without electrostatic damage, in cases in which a processing chamber for manufacturing the TFT substrate and a processing chamber for manufacturing light emitting elements are physically separated and the substrate must be moved from one to the other. In addition, problems of contamination of the substrate due to alkaline metals used in the light emitting element materials, and deterioration of the light emitting elements due to moisture and gasses can be prevented by applying the constitution of the present invention, and a good tight emitting device can be realized.

What is claimed is:

1. A light emitting device comprising:
   a thin film transistor on an insulating surface, wherein the thin film transistor contains a semiconductor layer and a gate electrode over the semiconductor layer, wherein the gate electrode contains a first conductive layer which has a tapered cross section and a second conductive layer which does not have a tapered cross section over the first conductive layer, and wherein a top surface of the first conductive layer is wider than a bottom surface of the second conductive layer;
   an interlayer insulating film over the thin film transistor;
   an anode over the interlayer insulating film;
   a wiring electrically connected to the thin film transistor and the anode;
   a bank over the wiring and a portion of the anode;

an insulating film over the anode and an upper surface of the bank;

an organic compound layer over the anode with the insulating film interposed therebetween; and a cathode over the organic compound layer.

2. A device according to claim 1, wherein an average surface roughness (Ra) of the anode is in a range of 0.9 nm or less.

3. A device according to claim 1, wherein an average surface roughness (Ra) of the anode is in a range of 0.85 nm or less.

4. A device according to claim 1, wherein the interlayer insulating film comprises at least one selected from the group consisting of a silicon oxide film, a silicon nitride oxide film and a silicon oxide nitride film.

5. A device according to claim 1, wherein the bank is processed by a plasma; and wherein the bank comprises a hardened film including at least an element selected from the group consisting of hydrogen, nitrogen, halocarbon, hydrogen fluoride, and noble gas.

6. A device according to claim 1, wherein a second insulating film is formed over the interlayer insulating film; and wherein the second insulating film comprises at least one selected from the group consisting of a silicon nitride film and a diamond like carbon film.

7. A device according to claim 1, wherein the light emitting device is in combination with an electric device; and wherein the electric device is one selected from the group consisting of a display, a digital still camera, a notebook type personal computer, a mobile computer, an image reproduction apparatus including a recording medium, a goggle type display, a video camera and a mobile phone.

8. A device according to claim 1, wherein the bank is formed from a resin insulating film.

9. A device according to claim 1, wherein the leveling surface of the anode is formed by a wiping process using a porous material.

10. A device according to claim 1, wherein the insulating film contains at least one of polyimide, polyamide and polyimide amide.

11. A light emitting device comprising:

a thin film transistor on an insulating surface, wherein the thin film transistor contains a semiconductor layer and a gate electrode over the semiconductor layer, wherein the gate electrode contains a first conductive layer which has a tapered cross section and a second conductive layer which does not have a tapered cross section over the first conductive layer, and wherein a top surface of the first conductive layer is wider than a bottom surface of the second conductive layer;

an interlayer insulating film over the thin film transistor;

an anode over the interlayer insulating film;

a wiring electrically connected to the thin film transistor and the anode;

a bank over the wiring and a portion of the anode;

an insulating film over the anode and an upper surface of the bank;

an organic compound layer over the anode with the insulating film interposed therebetween; and a cathode over the organic compound layer, and wherein the insulating film is at a film thickness of 1 to 5 nm.

12. A device according to claim 11, wherein an average surface roughness (Ra) of the anode is in a range of 0.9 nm or less.

13. A device according to claim 11, wherein an average surface roughness (Ra) of the anode is in a range of 0.85 nm or less.

14. A device according to claim 11, wherein the interlayer insulating film comprises at least one selected from the group consisting of a silicon oxide film, a silicon nitride oxide film and a silicon oxide nitride film.

15. A device according to claim 11, wherein the bank is processed by a plasma; and wherein the bank comprises a hardened film including at least an element selected from the group consisting of hydrogen, nitrogen, halocarbon, hydrogen fluoride, and noble gas.

16. A device according to claim 11, wherein a second insulating film is formed over the interlayer insulating film; and wherein the second insulating film comprises at least one selected from the group consisting of a silicon nitride film and a diamond like carbon film.

17. A device according to claim 11, wherein the light emitting device is in combination with an electric device; and wherein the electric device is one selected from the group consisting of a display, a digital still camera, a notebook type personal computer, a mobile computer, an image reproduction apparatus including a recording medium, a goggle type display, a video camera and a mobile phone.

18. A device according to claim 11, wherein the bank is formed from a resin insulating film.

19. A device according to claim 11, wherein the leveling surface of the anode is formed by a wiping process using a porous material.

20. A device according to claim 11, wherein the insulating film contains at least one of polyimide, polyamide and polyimide amide.

21. A light emitting device comprising:

a thin film transistor on an insulating surface, wherein the thin film transistor contains a semiconductor layer and a gate electrode over the semiconductor layer, wherein the gate electrode contains a first conductive layer which has a tapered cross section and a second conductive layer which does not have a tapered cross section over the first conductive layer, and wherein a top surface of the first conductive layer is wider than a bottom surface of the second conductive layer;

an interlayer insulating film over the thin film transistor;

an anode over the interlayer insulating film;

a wiring electrically connected to the thin film transistor and the anode;

a bank over the wiring and a portion of the anode;

an insulating film over the anode and an upper surface of the bank;

an organic compound layer over the anode with the insulating film interposed therebetween; and a cathode over the organic compound layer, and wherein the anode is formed from indium tin oxide.

22. A device according to claim 21, wherein an average surface roughness (Ra) of the anode is in a range of 0.9 nm or less.

23. A device according to claim 21, wherein an average surface roughness (Ra) of the anode is in a range of 0.85 nm or less.

24. A device according to claim 21, wherein the interlayer insulating film comprises at least one selected from the group consisting of a silicon oxide film, a silicon nitride oxide film and a silicon oxide nitride film.

25. A device according to claim 21,
wherein the bank is processed by a plasma; and
wherein the bank comprises a hardened film including at least an element selected from the group consisting of hydrogen, nitrogen, halocarbon, hydrogen fluoride, and noble gas.

26. A device according to claim 21,
wherein a second insulating film is formed over the interlayer insulating film; and
wherein the second insulating film comprises at least one selected from the group consisting of a silicon nitride film and a diamond like carbon film.

27. A device according to claim 21,
wherein the light emitting device is in combination with an electric device; and
wherein the electric device is one selected from the group consisting of a display, a digital still camera, a notebook type personal computer, a mobile computer, an image reproduction apparatus including a recording medium, a goggle type display, a video camera and a mobile phone.

28. A device according to claim 21,
wherein the bank is formed from a resin insulating film.

29. A device according to claim 21,
wherein the leveling surface of the anode is formed by a wiping process using a porous material.

30. A device according to claim 21, wherein the insulating film contains at least one of polyimide, polyamide and polyimide amide.

31. A light emitting device comprising:
a thin film transistor on an insulating surface, wherein the thin film transistor contains a semiconductor layer and a gate electrode over the semiconductor layer, wherein the gate electrode contains a first conductive layer which has a tapered cross section and a second conductive layer which does not have a tapered cross section over the first conductive layer, and wherein a top surface of the first conductive layer is wider than a bottom surface of the second conductive layer;
an interlayer insulating film over the thin film transistor;
an anode over the interlayer insulating film;
a wiring electrically connected to the thin film transistor and the anode;
a bank over the wiring and a portion of the anode;
an insulating film over the anode and an upper surface of the bank;
an organic compound layer over the anode with the insulating film interposed therebetween; and
a cathode over the organic compound layer,
wherein the insulating film is at a film thickness of 1 to 5 nm, and
wherein the anode is formed from indium tin oxide.

32. A device according to claim 31, wherein an average surface roughness (Ra) of the anode is in a range of 0.9 nm or less.

33. A device according to claim 31, wherein an average surface roughness (Ra) of the anode is in a range of 0.85 nm or less.

34. A device according to claim 31, wherein the interlayer insulating film comprises at least one selected from the group consisting of a silicon oxide film, a silicon nitride oxide film and a silicon oxide nitride film.

35. A device according to claim 31,
wherein the bank is processed by a plasma; and
wherein the bank comprises a hardened film including at least an element selected from the group consisting of hydrogen, nitrogen, halocarbon, hydrogen fluoride, and noble gas.

36. A device according to claim 31,
wherein a second insulating film is formed over the interlayer insulating film; and
wherein the second insulating film comprises at least one selected from the group consisting of a silicon nitride film and a diamond like carbon film.

37. A device according to claim 31,
wherein the light emitting device is in combination with an electric device; and
wherein the electric device is one selected from the group consisting of a display, a digital still camera, a notebook type personal computer, a mobile computer, an image reproduction apparatus including a recording medium, a goggle type display, a video camera and a mobile phone.

38. A device according to claim 31,
wherein the bank is formed from a resin insulating film.

39. A device according to claim 31,
wherein the leveling surface of the anode is formed by a wiping process using a porous material.

40. A device according to claim 31, wherein the insulating film contains at least one of polyimide, polyamide and polyimide amide.

* * * * *